(12) United States Patent
Kim et al.

(10) Patent No.: US 12,058,941 B2
(45) Date of Patent: Aug. 6, 2024

(54) MAGNETIC MEMORY DEVICE

(71) Applicant: Samsung Electronics Co., Ltd., Suwon-si (KR)

(72) Inventors: Yongjae Kim, Suwon-si (KR); Kuhoon Chung, Seoul (KR); Gwanhyeob Koh, Seoul (KR); Bae-Seong Kwon, Incheon (KR); Kyungtae Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 731 days.

(21) Appl. No.: 17/083,943

(22) Filed: Oct. 29, 2020

(65) Prior Publication Data

US 2021/0242396 A1 Aug. 5, 2021

(30) Foreign Application Priority Data

Jan. 31, 2020 (KR) .................. 10-2020-0012067

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/20* (2023.02); *H10N 50/01* (2023.02)

(58) Field of Classification Search
CPC ............................. H10N 50/80; H10B 61/20
USPC ..................................................... 257/427
See application file for complete search history.

(56) References Cited

U.S. PATENT DOCUMENTS

| | | | |
|---|---|---|---|
| 8,673,654 B2 | 3/2014 | Hong et al. | |
| 8,952,434 B2 | 2/2015 | Nam | |
| 9,129,690 B2 | 9/2015 | Park et al. | |
| 10,056,543 B2 | 8/2018 | Bak et al. | |
| 10,121,964 B2 | 11/2018 | Tan et al. | |
| 10,134,808 B2 | 11/2018 | Kan et al. | |
| 10,199,572 B2 | 2/2019 | Yi et al. | |
| 10,276,634 B2 | 4/2019 | Lin et al. | |
| 10,283,698 B2 | 5/2019 | Ko et al. | |
| 10,304,903 B2 | 5/2019 | Chuang et al. | |
| 10,395,979 B2 | 8/2019 | Kim et al. | |
| 11,152,561 B2* | 10/2021 | Kwon | H10N 50/10 |
| 2007/0187785 A1 | 8/2007 | Hung et al. | |
| 2012/0315707 A1* | 12/2012 | Nam | G11C 11/161 |
| | | | 257/E43.006 |
| 2013/0032910 A1 | 2/2013 | Jung et al. | |
| 2018/0277517 A1 | 9/2018 | Kim et al. | |
| 2018/0366517 A1* | 12/2018 | Lin | H10N 50/01 |

(Continued)

FOREIGN PATENT DOCUMENTS

| | | |
|---|---|---|
| KR | 101166356 B1 | 7/2012 |
| KR | 20180082709 A | 7/2018 |
| KR | 20190072065 A | 6/2019 |

*Primary Examiner* — Jami Valentine Miller
(74) *Attorney, Agent, or Firm* — Myers Bigel, P.A.

(57) ABSTRACT

A magnetic memory device includes a lower contact plug on a substrate and a data storage structure on the lower contact plug. The data storage structure includes a bottom electrode, a magnetic tunnel junction pattern, and a top electrode that are sequentially stacked on the lower contact plug. The lower contact plug and the data storage structure have a first thickness and a second thickness, respectively, in a first direction perpendicular to a top surface of the substrate. The first thickness of the lower contact plug is about 2.0 to 3.6 times the second thickness of the data storage structure.

12 Claims, 13 Drawing Sheets

(56) References Cited

U.S. PATENT DOCUMENTS

2018/0374895 A1   12/2018  Hsu et al.
2019/0036014 A1    1/2019  Ha
2019/0148633 A1    5/2019  Dai et al.
2019/0165257 A1    5/2019  Lee et al.
2020/0395531 A1* 12/2020  Kwon ................... H10N 50/80

* cited by examiner

MAGNETIC MEMORY DEVICE

CROSS-REFERENCE TO RELATED APPLICATION

This U.S. nonprovisional application claims priority under 35 U.S.C. § 119 to Korean Patent Application No. 10-2020-0012067 filed on Jan. 31, 2020 in the Korean Intellectual Property Office, the disclosure of which is hereby incorporated by reference in its entirety.

FIELD

The present inventive concepts relate to a magnetic memory device including a magnetic tunnel junction and a method of fabricating the same.

BACKGROUND

As electronic products trend toward higher speeds and/or lower power consumption, higher speed and lower operating voltages may be increasingly demanded for semiconductor memory devices incorporated in the electronic products. In order to meet the above demand, magnetic memory devices have been developed as semiconductor memory devices. Because magnetic memory devices may operate at high speeds and have nonvolatile characteristics, magnetic memory devices have attracted considerable attention as the next-generation semiconductor memory devices.

In general, a magnetic memory device may include a magnetic tunnel junction pattern (MTJ). The magnetic tunnel junction pattern includes two magnetic structures and an insulation layer interposed therebetween. The resistance of the magnetic tunnel junction pattern varies depending on magnetization directions of the two magnetic structures. For example, the magnetic tunnel junction pattern may have a high resistance state when the magnetization directions of the two magnetic structures are anti-parallel and a low resistance state when the magnetization directions of the two magnetic structures are parallel. The magnetic memory device may write and read data using the resistance difference between the high and low resistance states of the magnetic tunnel junction.

With the marked advances in electronic industry, there may be increasing demand for higher integration and/or lower power consumption of magnetic memory devices.

SUMMARY

Some example embodiments of the present inventive concepts provide a magnetic memory device having a structure configured for reducing or minimizing process defects and a method of fabricating the same.

Some example embodiments of the present inventive concepts provide a magnetic memory device with improved characteristics and a method of fabricating the same.

According to some example embodiments of the present inventive concepts, a magnetic memory device may include a lower contact plug on a substrate; and a data storage structure on the lower contact plug. The data storage structure may include a bottom electrode, a magnetic tunnel junction pattern, and a top electrode that are sequentially stacked on the lower contact plug. The lower contact plug and the data storage structure may have a first thickness and a second thickness, respectively in a first direction perpendicular to a top surface of the substrate. The first thickness of the lower contact plug may be about 2.0 to 3.6 times the second thickness of the data storage structure.

According to some example embodiments of the present inventive concepts, a magnetic memory device may include a bottom electrode, a magnetic tunnel junction pattern, and a top electrode that are sequentially stacked on a substrate. The magnetic tunnel junction pattern may include: a free layer; a pinned layer between the bottom electrode and the free layer; and a tunnel barrier layer between the pinned layer and the free layer. In a direction parallel to a top surface of the substrate, a middle portion of the pinned layer may be wider than an upper portion of the pinned layer, and may be wider than a lower portion of the pinned layer.

DETAILED DESCRIPTION OF EMBODIMENTS

The following will now describe in detail some example embodiments of the present inventive concepts with reference to the accompanying drawings.

Figure 1:
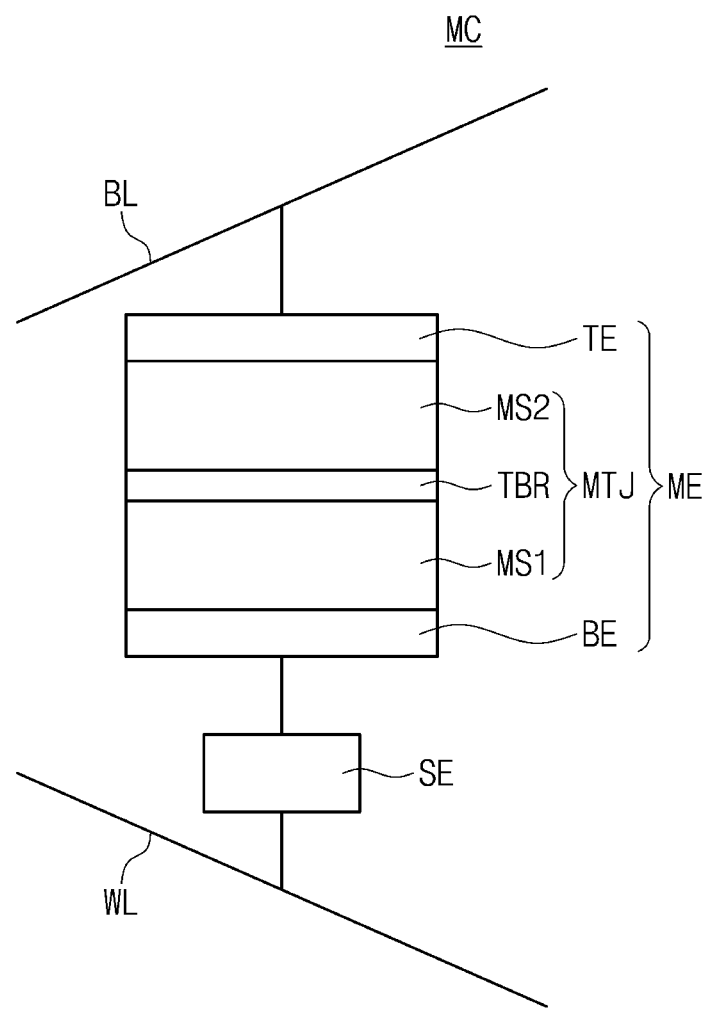
FIG. 1 illustrates a circuit diagram showing a unit memory cell of a magnetic memory device according to some example embodiments of the present inventive concepts.

FIG. 1 illustrates a circuit diagram showing a unit memory cell of a magnetic memory device according to some example embodiments of the present inventive concepts.

Referring to FIG. 1, a unit memory cell MC may include a memory element ME and a select element SE. The memory element ME may be connected between a bit line BL and the select element SE, and the select element SE may be connected between the memory element ME and a word line WL. As described herein, elements that are "on" or "connected to" or "contact" one another may be directly on or connected to or contact one another, or intervening elements may be present. When elements are "directly on" or "directly connected to" or "directly contact" one another, no intervening elements are present. Elements that are "connected" may be electrically and/or physically connected. The memory element ME may be a variable resistance device that is switched between two resistance states when being supplied with an electrical pulse. The memory element ME may have its electrical resistance that is changed by a spin transferring phenomenon of an electric current passing through the memory element ME. The memory element ME may have a thin-film structure configured to exhibit magneto-resistance properties, and may include at least one ferromagnetic material and/or at least one antiferromagnetic material. The select element SE may be configured to selectively control a charge flow passing across the memory element ME. For example, the select element SE may be one of a diode, a PNP bipolar transistor, an NPN bipolar transistor, an NMOS field effect transistor, and a PMOS field effect transistor. When the select element SE is configured as a three-terminal device such as a bipolar transistor or a MOS field effect transistor, an additional line may be connected to the select element SE.

The memory element ME may include a magnetic tunnel junction pattern MTJ. The magnetic tunnel junction pattern MTJ may include a first magnetic structure MS1, a second magnetic structure MS2, and a tunnel barrier pattern TBR between the first and second magnetic structures MS1 and MS2. The terms "first," "second," etc. may be used herein to distinguish one element from another. Each of the first and second magnetic structures MS1 and MS2 may include at least one magnetic layer formed of a magnetic material. The memory element ME may further include a bottom electrode BE between the magnetic tunnel junction pattern MTJ and the select element SE and a top electrode TE between the magnetic tunnel junction pattern MTJ and the bit line BL.

Figure 2:
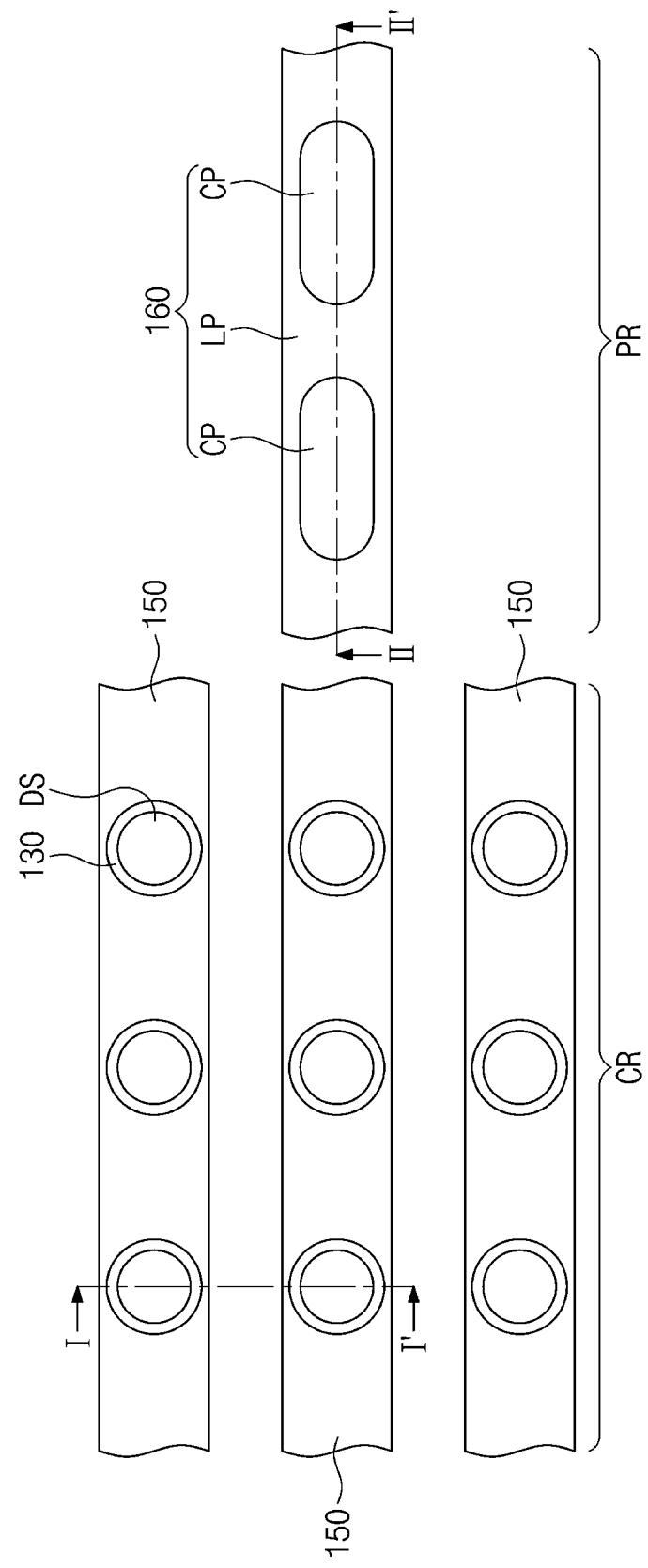
FIG. 2 illustrates a plan view showing a magnetic memory device according to some example embodiments of the present inventive concepts.
Figure 3:
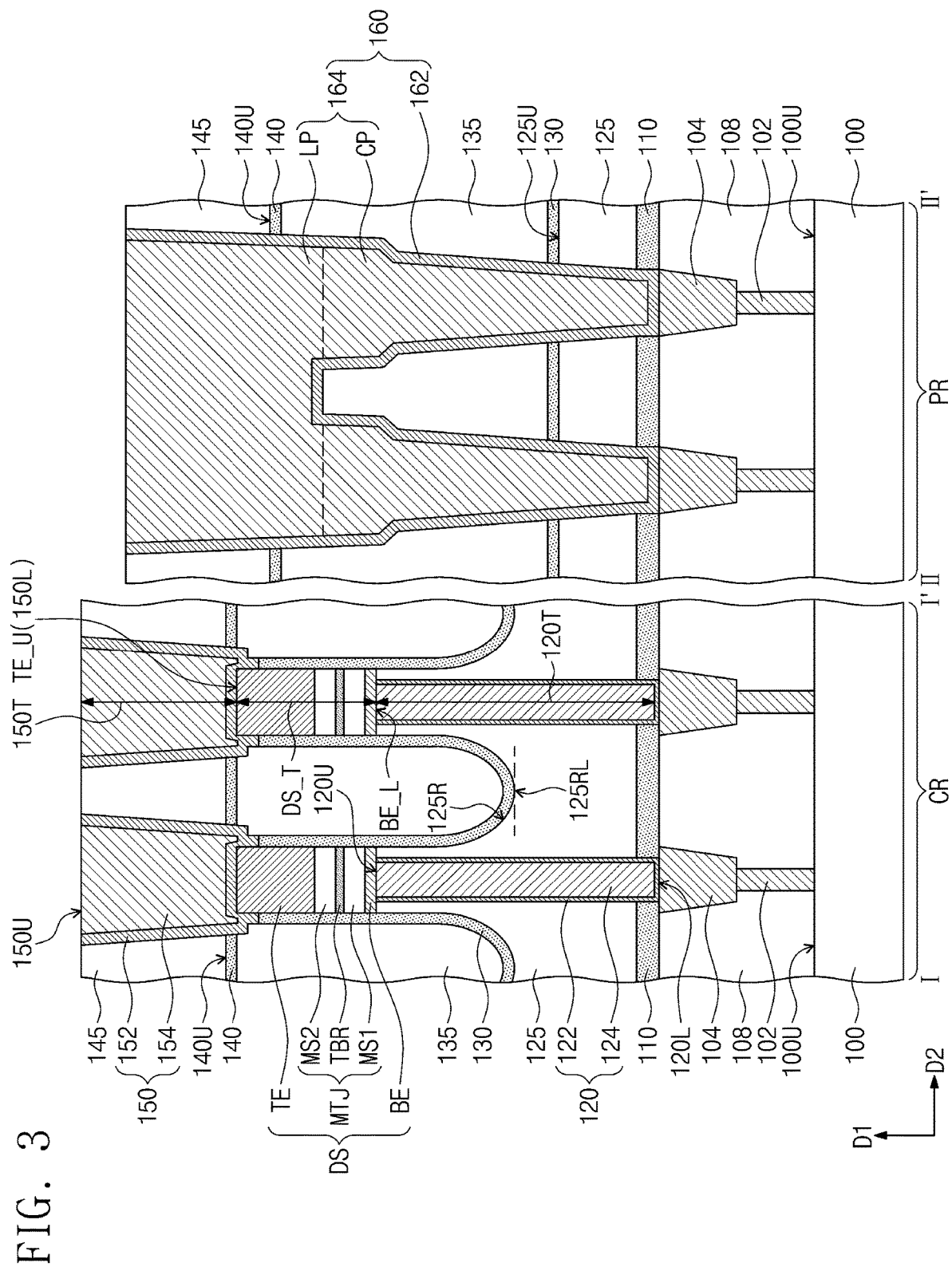
FIG. 3 illustrates a cross-sectional view taken along lines I-I' and II-II' of FIG. 2.
Figure 4A:
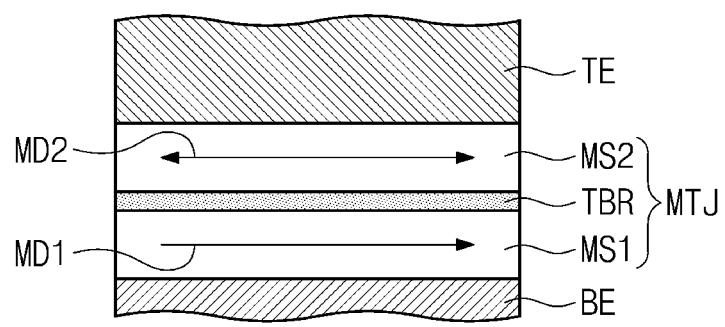
FIGS. 4A and 4B illustrate cross-sectional views exemplarily showing a magnetic tunnel junction pattern of a magnetic memory device according to some example embodiments of the present inventive concepts.
Figure 4B:
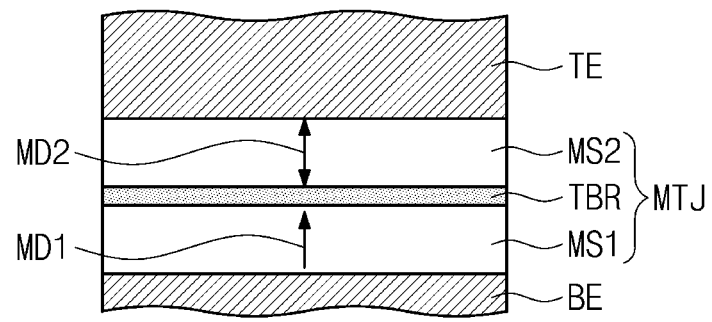

FIG. 2 illustrates a plan view showing a magnetic memory device according to some example embodiments of the present inventive concepts. FIG. 3 illustrates a cross-sectional view taken along lines I-I' and II-II' of FIG. 2. FIGS. 4A and 4B illustrate cross-sectional views exemplarily showing a magnetic tunnel junction pattern of a magnetic memory device according to some example embodiments of the present inventive concepts.

Referring to FIGS. 2 and 3, lower lines 104 and lower contacts 102 may be disposed on a substrate 100. The substrate 100 may be a semiconductor substrate including silicon, silicon on insulator (SOI), silicon-germanium (SiGe), germanium (Ge), gallium-arsenic (GaAs), or the like. The substrate 100 may include a cell region CR and a peripheral circuit region PR. The cell region CR may be a region of the substrate 100 where memory cells are provided. The peripheral circuit region PR may be another region of the substrate where is provided a peripheral circuit for driving the memory cells. The lower lines 104 and the lower contacts 102 may be disposed on the cell region CR and the peripheral circuit region PR of the substrate 100.

The lower lines 104 may be spaced apart from a top surface 100U of the substrate 100 in a first direction D1 perpendicular to the top surface 100U of the substrate 100. The lower contacts 102 may be disposed between the substrate 100 and the lower lines 104, and each of the lower lines 104 may be electrically connected to the substrate 100 through a corresponding one of the lower contacts 102. The lower lines 104 and the lower contacts 102 may include metal (e.g., copper).

Select elements may be disposed in the substrate 100. The select elements may be, for example, field effect transistors. Each of the lower lines 104 may be electrically connected through a corresponding one of the lower contacts 102 to one terminal of a corresponding one of the select elements.

The substrate 100 may be provided thereon with a first lower interlayer dielectric layer 108 that covers the cell region CR and the peripheral circuit region PR and further covers the lower lines 104 and the lower contacts 102. As used herein, an element that "covers" another element does not require complete coverage. The lower lines 104 may have their top surfaces substantially coplanar with the top surface of the first lower interlayer dielectric layer 108. For example, the top surfaces of the lower lines 104 may be located at substantially the same height as that of the top surface of the first lower interlayer dielectric layer 108. In this description, the term "height" may indicate a distance measured along the first direction D1 from the top surface 100U of the substrate 100. The first lower interlayer dielectric layer 108 may include, for example, one or more of oxide, nitride, or oxynitride.

A second lower interlayer dielectric layer 125 may be disposed on the first lower interlayer dielectric layer 108, and a lower dielectric layer 110 may be interposed between the first lower interlayer dielectric layer 108 and the second lower interlayer dielectric layer 125. The lower dielectric layer 110 and the second lower interlayer dielectric layer 125 may cover the cell region CR and the peripheral circuit region PR. The second lower interlayer dielectric layer 125 may include, for example, one or more of oxide, nitride, or oxynitride. The lower dielectric layer 110 may include a different material from those of the first and second lower interlayer dielectric layers 108 and 125. The lower dielectric layer 110 may include a material having an etch selectivity with respect to the first and second lower interlayer dielectric layers 108 and 125. The lower dielectric layer 110 may include nitride (e.g., silicon oxide).

A lower contact plug 120 may be disposed on the cell region CR of the substrate 100. The lower contact plug 120 may be provided in plural, and the plurality of lower contact plugs 120 may be spaced apart from each other in a second direction D2 parallel to the top surface 100U of the substrate 100. Each of the plurality of lower contact plugs 120 may penetrate the second lower interlayer dielectric layer 125 and the lower dielectric layer 110, and may have a connection with a corresponding one of the lower lines 104. The lower contact plug 120 may include a lower contact pattern 124 and a lower barrier pattern 122. The lower contact pattern 124 may be disposed in the second lower interlayer dielectric layer 125 and the lower dielectric layer 110. The lower barrier pattern 122 may be interposed between the second lower interlayer dielectric layer 125 and a lateral surface (e.g., a sidewall or side surface) of the lower contact pattern 124 and between the lower dielectric layer 110 and the lateral surface of the lower contact pattern 124, and may extend between the lower line 104 and a bottom surface of the lower contact pattern 124. The lower contact pattern 124 may include a doped semiconductor material (e.g., doped silicon), metal (e.g., tungsten, titanium, and/or tantalum), and/or a metal-semiconductor compound (e.g., metal silicide), and the lower barrier pattern 122 may include conductive metal nitride (e.g., titanium nitride, tantalum nitride, and/or tungsten nitride).

A data storage structure DS may be disposed on the cell region CR of the substrate 100. The data storage structure DS may be provided in plural, and the plurality of data storage structures DS may be spaced apart from each other in the second direction D2. The plurality of data storage structures DS may be disposed on and connected to corresponding lower contact plugs 120.

The data storage structure DS may include a bottom electrode BE, a magnetic tunnel junction pattern MTJ, and a top electrode TE that are sequentially stacked on the lower contact plug 120. The bottom electrode BE may be disposed between the lower contact plug 120 and the magnetic tunnel junction pattern MTJ, and the magnetic tunnel junction pattern MTJ may be disposed between the bottom electrode BE and the top electrode TE. The magnetic tunnel junction pattern MTJ may include a first magnetic structure MS1, a second magnetic structure MS2, and a tunnel barrier pattern TBR between the first and second magnetic structures MS1 and MS2. The first magnetic structure MS1 may be disposed between the bottom electrode BE and the tunnel barrier pattern TBR, and the second magnetic structure MS2 may be disposed between the top electrode TE and the tunnel barrier pattern TBR. The bottom electrode BE may include, for example, conductive metal nitride (e.g., titanium nitride or tantalum nitride). The top electrode TE may include metal (e.g., Ta, W, Ru, or Ir) and/or conductive metal nitride (e.g., TiN).

Referring to FIGS. 4A and 4B, the first magnetic structure MS1 may include a reference layer having a magnetization direction MD1 that is unidirectionally fixed, and the second magnetic structure MS2 may include a free layer having a magnetization direction MD2 that can be changed to be parallel or antiparallel to the magnetization direction MD1 of the first magnetic structure MS1. FIGS. 4A and 4B show an example in which the second magnetic structure MS2 includes a free layer, but the present inventive concepts are not necessarily limited thereto. As an alternative to those shown in FIGS. 4A and 4B, the first magnetic structure MS1 may include a free layer, and the second magnetic structure MS2 may include a reference layer. As an example, shown in FIG. 4A, the magnetization directions MD1 and MD2 of the first and second magnetic structures MS1 and MS2 may be parallel to an interface between the tunnel barrier pattern TBR and the second magnetic structure MS2. In this case, each of the first and second magnetic structures MS1 and MS2 may include a ferromagnetic material. The first magnetic structure MS1 may further include an antiferromagnetic material for fixing a magnetization direction of the ferromagnetic material in the first magnetic structure MS1. As another example, as shown in FIG. 4B, the magnetization directions MD1 and MD2 of the first and second magnetic structures MS1 and MS2 may be perpendicular to the interface between the tunnel barrier pattern TBR and the second magnetic structure MS2. In this case, each of the first and second magnetic structures MS1 and MS2 may include a perpendicular magnetic material (e.g., CoFeTb, CoFeGd, or CoFeDy), a perpendicular magnetic material having an $L_{10}$ structure, CoPt of a hexagonal close packed (HCP) lattice structure, and/or a perpendicular magnetization structure. The perpendicular magnetic material having the $L_{10}$ structure may include FePt of the $L_{10}$ structure, FePd of the $L_{10}$ structure, CoPd of the $L_{10}$ structure, and/or CoPt of the $L_{10}$ structure. The perpendicular magnetization structure may include magnetic layers and non-magnetic layers that are alternately and repeatedly stacked. For example, the perpendicular magnetization structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n (where, n is the number of stacked layers). As a still other example, each of the first and second magnetic structures MS1 and MS2 may include Heusler Alloy or Co-based Heusler Alloy.

The tunnel barrier pattern TBR may include a magnesium (Mg) oxide layer, a titanium (Ti) oxide layer, an aluminum (Al) oxide layer, a magnesium-zinc (Mg—Zn) oxide layer, and/or a magnesium-boron (Mg—B) oxide layer.

Referring back to FIGS. 2 and 3, each of the lower contact plug 120 and the data storage structure DS may have a thickness in the first direction D1. The lower contact plug 120 may have a first thickness 120T that is a vertical length or distance measured along the first direction D1 from a bottom surface 120L of the lower contact plug 120 to a top surface 120U of the lower contact plug 120. The bottom surface 120L of the lower contact plug 120 may be in contact with a corresponding one of the lower lines 104, and the top surface 120U of the lower contact plug 120 may be in contact with the bottom electrode BE of the data storage structure DS. The data storage structure DS may have a second thickness DS_T that is a vertical length measured along the first direction D1 from a bottom surface BE_L of the bottom electrode BE to a top surface TE_U of the top surface TE. The bottom surface BE_L of the bottom electrode BE may be in contact with the lower contact plug 120.

The first thickness 120T of the lower contact plug 120 may be about 2.0 to 3.6 times the second thickness DS_T of the data storage structure DS. For example, a ratio of the second thickness DS_T to the first thickness 120T may be about 1:2 to about 1:3.6 (DS_T:120T=1:2.0 to approximately 3.6), which may be configured to improve electrical characteristics and/or reduce process defects as described herein. When the first thickness 120T is less than about twice the second thickness DS_T, the second thickness DS_T of the data storage structure DS may relatively increase. In this case, the magnetic tunnel junction pattern MTJ in the data storage structure DS may relatively increase in thickness, and thus the magnetic tunnel junction pattern MTJ may have poor characteristics. When the first thickness 120T is greater than about 3.6 times the second thickness DS_T, the lower contact plug 120 may relatively increase in aspect ratio. In this case, there may be an increase in the occurrence of process defects, such as voids in the lower contact plug 120.

On the cell region CR, the second lower interlayer dielectric layer 125 may have a recess 125R extending toward the substrate 100 on opposite sides of the data storage structure DS (e.g., between the plurality of data storage structures DS). A lowermost surface 125RL of the recess 125R may be located at a height lower than that of or closer to the substrate 100 than the top surface 120U of the lower contact plug 120. A top surface 125U of the second lower interlayer dielectric layer 125 on the peripheral circuit region PR may be located at a height lower than that of or closer to the substrate 100 than the lowermost surface 125RL of the recess 125R of the second lower interlayer dielectric layer 125 on the cell region CR.

A protective dielectric layer 130 may cover a lateral surface (e.g., a sidewall or side surface) of the data storage structure DS. When viewed in plan, the protective dielectric layer 130 may surround the lateral surface of the data storage structure DS. The protective dielectric layer 130 may cover a lateral surface of each of the bottom electrode BE, the magnetic tunnel junction pattern MTJ, and the top electrode TE, and when viewed in plan, the protective dielectric layer 130 may surround the lateral surface of each of the bottom electrode BE, the magnetic tunnel junction pattern MTJ, and the top electrode TE. The protective dielectric layer 130 may extend onto an inner surface of the recess 125R of the second lower interlayer dielectric layer 125 on the cell region CR, and may conformally cover the inner surface of the recess 125R. The protective dielectric layer 130 may extend onto the peripheral circuit region PR, and may cover the top surface 125U of the second lower interlayer dielectric layer 125 on the peripheral circuit region PR.

A first upper interlayer dielectric layer 135 may be disposed on the protective dielectric layer 130, and may cover the cell region CR and the peripheral circuit region PR. The first upper interlayer dielectric layer 135 may cover the data storage structure DS on the cell region CR. The protective dielectric layer 130 may be interposed between the first upper interlayer dielectric layer 135 and the lateral surface of the data storage structure DS, and may extend between the first upper interlayer dielectric layer 135 and the inner surface of the recess 125R of the second lower interlayer dielectric layer 125 on the cell region CR. The protective dielectric layer 130 may extend between the first upper interlayer dielectric layer 135 and the top surface 125U of the second lower interlayer dielectric layer 125 on the peripheral circuit region PR.

The first upper interlayer dielectric layer 135 may include one or more of oxide, nitride, or oxynitride. The protective dielectric layer 130 may include a different material from that of the first upper interlayer dielectric layer 135 and that of the second lower interlayer dielectric layer 125. The protective dielectric layer 130 may include a material having an etch selectivity with respect to the first upper interlayer dielectric layer 135 and the second lower interlayer dielectric layer 125. The protective dielectric layer 130 may include nitride (e.g., silicon nitride).

A second upper interlayer dielectric layer 145 may be disposed on the first upper interlayer dielectric layer 135, and an upper dielectric layer 140 may be interposed between the first upper interlayer dielectric layer 135 and the second upper interlayer dielectric layer 145. The upper dielectric layer 140 and the second upper interlayer dielectric layer 145 may cover the cell region CR and the peripheral circuit region PR. A top surface 140U of the upper dielectric layer 140 on the peripheral circuit region PR may be located at a height lower than that of a top surface 140U of the upper dielectric layer 140 on the cell region CR. The second upper interlayer dielectric layer 145 may include one or more of oxide, nitride, or oxynitride. The upper dielectric layer 140 may include a different material from those of the first and second upper interlayer dielectric layers 135 and 145. The upper dielectric layer 140 may include a material having an etch selectivity with respect to the first and second upper interlayer dielectric layers 135 and 145. The upper dielectric layer 140 may include nitride (e.g., silicon nitride).

An upper line 150 may be disposed on the cell region CR of the substrate 100. The upper line 150 may be provided in plural, and the plurality of upper lines 150 may be spaced apart from each other in the second direction D2. Each of the plurality of upper lines 150 may be connected to a corresponding one or more of the plurality of data storage structures DS.

The upper line 150 may penetrate the second upper interlayer dielectric layer 145 and the upper dielectric layer 140, and may have a connection with the data storage structure DS. The upper line 150 may be in contact with the top surface TE_U of the top electrode TE included in the data storage structure DS. According to some example embodiments, the upper line 150 may cover the top surface TE_U of the top electrode TE, and may extend onto the lateral surface of the top electrode TE to partially cover the lateral surface of the top electrode TE. The upper line 150 may include an upper line pattern 154 and an upper barrier pattern 152. The upper line pattern 154 may penetrate the second upper interlayer dielectric layer 145 and the upper dielectric layer 140. The upper barrier pattern 152 may be interposed between the second upper interlayer dielectric layer 145 and a lateral surface of the upper line pattern 154 and between the upper dielectric layer 140 and the lateral surface of the upper line pattern 154, and may extend between a bottom surface of the upper line pattern 154 and the top surface TE_U of the top electrode TE. According to some example embodiments, the upper barrier pattern 152 may extend onto and partially cover the lateral surface of the top electrode TE. The upper line pattern 154 may include metal (e.g., copper), and the upper barrier pattern 152 may include conductive metal nitride.

The upper line 150 may have a thickness in the first direction D1. The upper line 150 may have a third thickness 150T that is a vertical length measured along the first direction D1 from a bottom surface 150L of the upper line 150 to a top surface 150U of the upper line 150. The bottom surface 150L of the upper line 150 may be in contact with the top surface TE_U of the top electrode TE. The third thickness 150T of the upper line 150 may be about 1.0 to 2.2 times the second thickness DS_T of the data storage structure DS. For example, a ratio of the second thickness DS_T to the third thickness 150T may be about 1:1 to about 1:2.2 (DS_T:150T=1:1 to approximately 2.2) which may be configured to improve electrical characteristics as described herein. When the third thickness 150T is less than the second thickness DS_T, the second thickness DS_T of the data storage structure DS may relatively increase. In this case, the magnetic tunnel junction pattern MTJ in the data storage structure DS may relatively increase in thickness, and thus the magnetic tunnel junction pattern MTJ may have poor characteristics. Moreover, when the third thickness 150T is greater than about 2.2 times the second thickness DS_T, the second thickness DS_T of the data storage structure DS may relatively decrease. In this case, the magnetic tunnel junction pattern MTJ in the data storage structure DS may relatively decrease in thickness, and thus the magnetic tunnel junction pattern MTJ may have poor characteristics.

A peripheral line structure 160 may be disposed on the peripheral circuit region PR of the substrate 100. On the peripheral circuit region PR, the peripheral line structure 160 may penetrate the second upper interlayer dielectric layer 145, the upper dielectric layer 140, the first upper interlayer dielectric layer 135, the protective dielectric layer 130, the second lower interlayer dielectric layer 125, and the lower dielectric layer 110, and may have connections with the lower lines 104. The peripheral line structure 160 may include a peripheral conductive pattern 164 and a peripheral barrier pattern 162 that extends along lateral and bottom surfaces of the peripheral conductive pattern 164. On the peripheral circuit region PR, the peripheral conductive pattern 164 may penetrate the second upper interlayer dielectric layer 145, the upper dielectric layer 140, the first upper interlayer dielectric layer 135, the protective dielectric layer 130, and the second lower interlayer dielectric layer 125, and may further penetrate at least a portion of the lower dielectric layer 110.

The peripheral conductive pattern 164 may include a line pattern LP that extends in a direction (e.g., the second direction D2) parallel to the top surface 100U of the substrate 100, and may also include contact patterns CP that extend from the line pattern LP toward the substrate 100. The contact patterns CP may be horizontally spaced apart from each other along a direction (e.g., the second direction D2) parallel to the top surface 100U of the substrate 100. The contact patterns CP may be connected to corresponding lower lines 104, and the line pattern LP may be connected in common to (e.g., to multiple of) the contact patterns CP. On the peripheral circuit region PR, the line pattern LP may penetrate the second upper interlayer dielectric layer 145 and the upper dielectric layer 140, and may further penetrate an upper portion of the first upper interlayer dielectric layer 135. On the peripheral circuit region PR, each of the contact patterns CP may penetrate a lower portion of the first upper interlayer dielectric layer 135, the protective dielectric layer 130, and the second lower interlayer dielectric layer 125, and may further penetrate at least a portion of the lower dielectric layer 110. A portion of each of the first upper interlayer dielectric layer 135, the protective dielectric layer 130, and the second lower interlayer dielectric layer 125 may be interposed between the contact patterns CP. In some example embodiments, the first upper interlayer dielectric layer 135 may have a stepwise shape at a lateral surface of the portion between the contact patterns CP. Each of the contact patterns CP may have a lateral surface that faces the lateral surface of the portion of the first upper interlayer dielectric layer 135, and therefore the lateral surface of each of the contact patterns CP may have a stepwise shape.

The peripheral barrier pattern 162 may be interposed between the lower dielectric layer 110 and each of the contact patterns CP, between the second lower interlayer dielectric layer 125 and each of the contact patterns CP, between the protective dielectric layer 130 and each of the contact patterns CP, and between the first upper interlayer dielectric layer 135 and each of the contact patterns CP. The peripheral barrier pattern 162 may extend between each of the contact patterns CP and the lower line 104 that corresponds to the each of the contact patterns CP. The peripheral barrier pattern 162 may extend between the line pattern LP and the first upper interlayer dielectric layer 135, between the line pattern LP and the upper dielectric layer 140, and between the line pattern LP and the second upper interlayer dielectric layer 145. The line pattern LP and the contact patterns CP may contact each other to constitute a single or unitary body without boundaries therebetween.

The peripheral conductive pattern 164 may have a top surface (or a top surface of the line pattern LP) substantially coplanar with that of the second upper interlayer dielectric layer 145, and the peripheral barrier pattern 162 may have an uppermost surface substantially coplanar with that of the second upper interlayer dielectric layer 145. The line pattern LP and the contact patterns CP may include the same material as each other. The line pattern LP and the contact patterns CP may include the same material as that of the upper line pattern 154. The line pattern LP and the contact patterns CP may include metal (e.g., copper). The peripheral barrier pattern 162 may include the same material as that of the upper barrier pattern 152. The peripheral barrier pattern 162 may include conductive metal nitride.

Figure 5A:
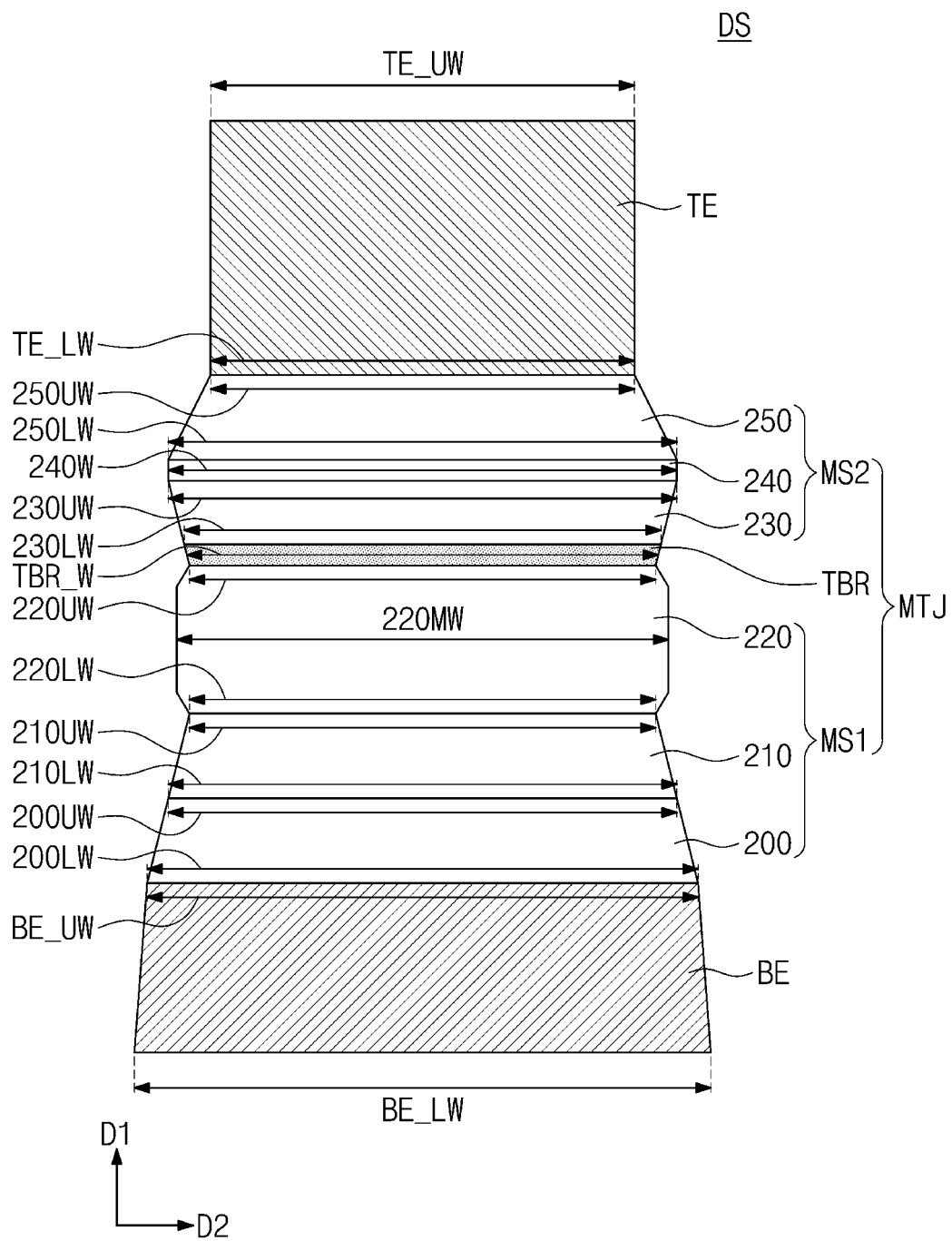
FIGS. 5A and 5B illustrate cross-sectional views showing a data storage structure of a magnetic memory device according to some example embodiments of the present inventive concepts.
Figure 5B:
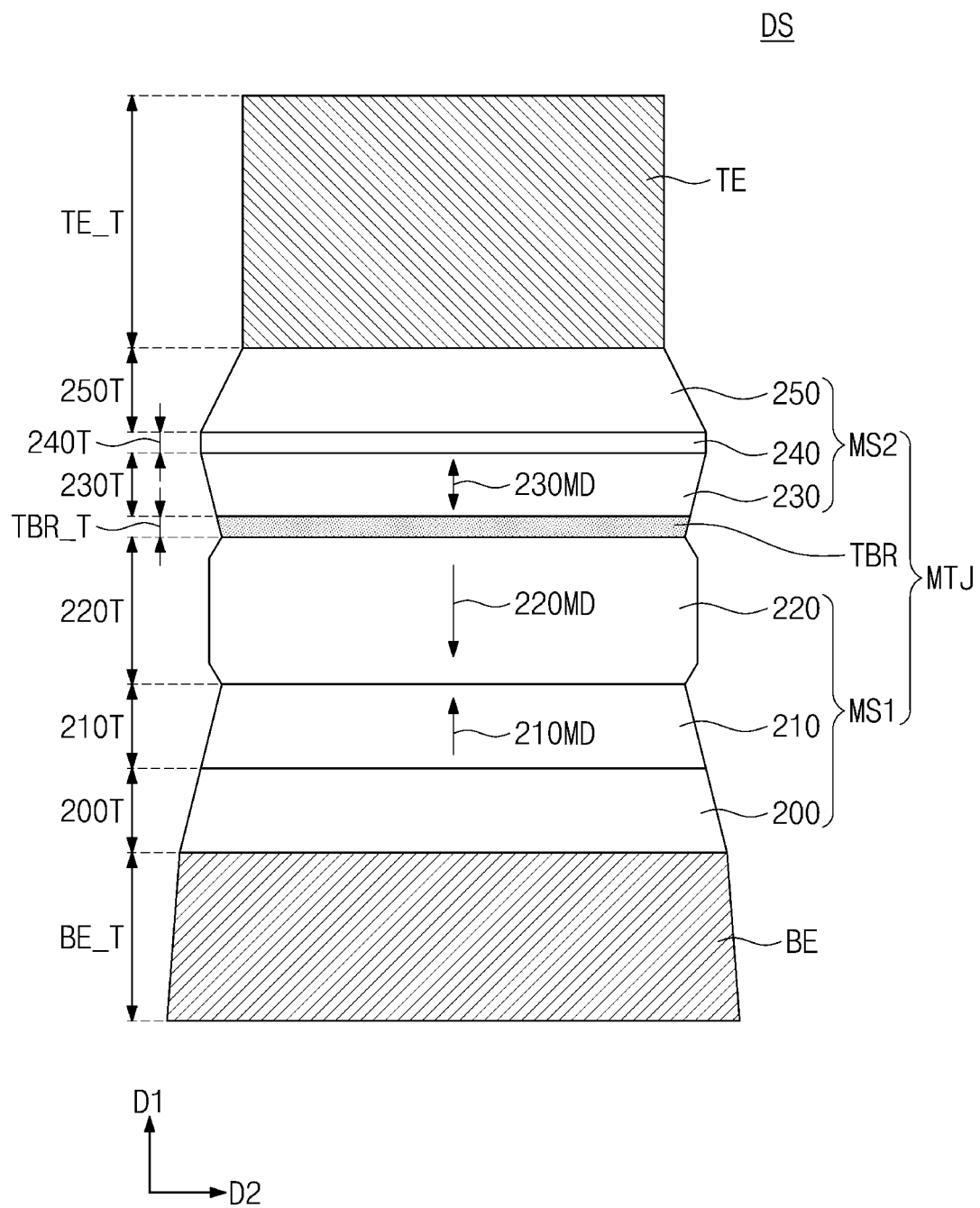

FIGS. 5A and 5B illustrate cross-sectional views showing a data storage structure of a magnetic memory device according to some example embodiments of the present inventive concepts.

Referring to FIGS. 5A and 5B, the data storage structure DS of FIG. 3 may include the bottom electrode BE, the magnetic tunnel junction pattern MTJ, and the top electrode TE, and the magnetic tunnel junction pattern MTJ may include the first magnetic structure MS1, the second magnetic structure MS2, and the tunnel barrier pattern TBR between the first and second magnetic structures MS1 and MS2.

According to some example embodiments, the first magnetic structure MS1 may include a seed layer 200 between the bottom electrode BE and the tunnel barrier pattern TBR, a first pinned layer 210 between the seed layer 200 and the tunnel barrier pattern TBR, and a second pinned layer 220 between the first pinned layer 210 and the tunnel barrier pattern TBR. The second magnetic structure MS2 may include a free layer 230 between the tunnel barrier pattern TBR and the top electrode TE, a non-magnetic layer 240 between the free layer 230 and the top electrode TE, and a capping layer 250 between the non-magnetic layer 240 and the top electrode TE.

The seed layer 200 may include a material that contributes to crystal growth of magnetic layers constituting the magnetic tunnel junction pattern MTJ. For example, the seed layer 200 may include chromium (Cr), iridium (Ir), and/or ruthenium (Ru).

According to some example embodiments, the first pinned layer 210 and the second pinned layer 220 may have a magnetization direction 210MD and a magnetization direction 220MD, respectively, that are perpendicular to an interface between the tunnel barrier pattern TBR and the free layer 230. The first pinned layer 210 may include one or more of the perpendicular magnetic materials discussed above with reference to FIG. 4B. For example, the first pinned layer 210 may include iron (Fe), cobalt (Co), and/or nickel (Ni). The second pinned layer 220 may include a plurality of magnetic layers and a plurality of non-magnetic layers that are alternately stacked on the first pinned layer 210. Each of the plurality of magnetic layers may include iron (Fe), cobalt (Co), and/or nickel (Ni), and each of the plurality of non-magnetic layers may include iridium (Ir) and/or ruthenium (Ru). The second pinned layer 220 may be antiferromagnetically coupled to the first pinned layer 210 through at least one of the plurality of non-magnetic layers. Therefore, the magnetization direction 220MD of the second pinned layer 220 may be antiparallel to the magnetization direction 210MD of the first pinned layer 210.

According to some example embodiments, the free layer 230 may include a magnetic material having perpendicular magnetization due to perpendicular magnetic anisotropy induced at the interface between the free layer 230 and the tunnel barrier pattern TBR. For example, the free layer 230 may include cobalt-iron-boron (CoFeB). For another example, the free layer 230 may include one or more of the perpendicular magnetic materials discussed above with reference to FIG. 4B. The non-magnetic layer 240 may include a magnesium (Mg) oxide layer, a titanium (Ti) oxide layer, an aluminum (Al) oxide layer, a magnesium-zinc (Mg—Zn) oxide layer, and/or a magnesium-boron (Mg—B) oxide layer. For example, the non-magnetic layer 240 may include the same material as that of the tunnel barrier pattern TBR. A magnetic anisotropy of the free layer 230 may be increased due to a magnetic anisotropy induced at an interface between the non-magnetic layer 240 and the free layer 230. The capping layer 250 may be used to prevent degradation of the free layer 230. The capping layer 250 may include, for example, tantalum (Ta), aluminum (Al), copper (Cu), gold (Au), silver (Ag), titanium (Ti), tantalum nitride (TaN), and/or titanium nitride (TiN).

The bottom electrode BE, the top electrode TE, and each of the layers 200, 210, 220, TBR, 230, 240, and 250 that constitute the magnetic tunnel junction pattern MTJ may have a width in a direction (e.g., the second direction D2) parallel to the interface between the tunnel barrier pattern TBR and the free layer 230. For example, the second direction D2 may be parallel to the top surface 100U of the substrate 100 shown in FIG. 3.

A width 230UW at an upper portion of the free layer 230 may be greater than a width 230LW at a lower portion of the free layer 230. The free layer 230 may have a width that progressively increases as approaching the upper portion from the lower portion thereof. Therefore, the free layer 230 may have a negative profile at its lateral surface inclined at an obtuse angle with respect to a bottom surface of the free layer 230. The width 230UW at the upper portion of the free layer 230 may be greater than a width TBR_W of the tunnel barrier pattern TBR. The width TBR_W of the tunnel barrier pattern TBR may be substantially the same as the width 230LW at the lower portion of the free layer 230.

The non-magnetic layer 240 may have a width 240W greater than the width TBR_W of the tunnel barrier pattern TBR. The width 240W of the non-magnetic layer 240 may be greater than the width 230LW at the lower portion of the free layer 230 and substantially the same as the width 230UW at the upper portion of the free layer 230.

A width 250UW at an upper portion of the capping layer 250 may be less than a width 250LW at a lower portion of the capping layer 250. The capping layer 250 may have a width that progressively decreases as approaching the upper portion from the lower portion thereof. Therefore, the capping layer 250 may have a positive profile at its lateral surface inclined at an acute angle with respect to a bottom surface of the capping layer 250. The width 250UW at the upper portion of the capping layer 250 may be less than the width 240W of the non-magnetic layer 240. The width 240W of the non-magnetic layer 240 may be substantially the same as the width 250LW at the lower portion of the capping layer 250.

According to some example embodiments, a width TE_UW at an upper portion of the top electrode TE may be substantially the same as a width TE_LW at a lower portion of the top electrode TE. The top electrode TE may have a width that is substantially constant from the upper portion to the lower portion thereof. Therefore, a lateral surface or sidewall of the top electrode TE may be substantially perpendicular to a bottom surface of the top electrode TE. The width TE_LW at the lower portion of the top electrode TE may be substantially the same as the width 250UW at the upper portion of the capping layer 250.

A width 220MW at a middle portion of the second pinned layer 220 may be greater than a width 220UW at an upper portion of the second pinned layer 220 and a width 220LW at a lower portion of the second pinned layer 220. Therefore, a lateral surface at the middle portion of the second pinned layer 220 may protrude laterally (e.g., in the second direction D2) more than a lateral surface at the upper portion of the second pinned layer 220 and a lateral surface at the lower portion of the second pinned layer 220. That is, a lateral surface of the second pinned layer 220 at the middle portion may protrude in the direction D2 beyond the upper portion and beyond the lower portion of the second pinned layer 220. The width 220MW at the middle portion of the second pinned layer 220 may be greater than the width TBR_W of the tunnel barrier pattern TBR. The width 220UW at the upper portion of the second pinned layer 220 and the width 220LW at the lower portion of the second pinned layer 220 may be substantially the same as the width TBR_W of the tunnel barrier pattern TBR. The width 230UW at the upper portion of the free layer 230 may be greater than the width 220UW at the upper portion of the second pinned layer 220, the width 220LW at the lower portion of the second pinned layer 220, and the width 220MW at the middle portion of the second pinned layer 220.

A width 210UW at an upper portion of the first pinned layer 210 may be less than a width 210LW at a lower portion of the first pinned layer 210. The first pinned layer 210 may have a width that progressively decreases as approaching the upper portion from the lower portion thereof. Therefore, the first pinned layer 210 may have a positive profile at its lateral surface inclined at an acute angle with respect to a bottom surface of the first pinned layer 210. The width 210UW at the upper portion of the first pinned layer 210 may be less than the width 220MW at the middle portion of the second pinned layer 220 and substantially the same as the width 220LW at the lower portion of the second pinned layer 220. The width 210LW at the lower portion of the first pinned layer 210 may be greater than the width 220LW at the lower portion of the second pinned layer 220 and the width 220MW at the middle portion of the second pinned layer 220.

A width 200UW at an upper portion of the seed layer 200 may be less than a width 200LW at a lower portion of the seed layer 200. The seed layer 200 may have a width that progressively decreases as approaching the upper portion from the lower portion thereof. Therefore, the seed layer 200 may have a positive profile at its lateral surface inclined at an acute angle with respect to a bottom surface of the seed layer 200. The width 200UW at the upper portion of the seed layer 200 may be greater than the width 210UW at the upper portion of the first pinned layer 210 and substantially the same as the width 210LW at the lower portion of the first pinned layer 210. The width 200LW at the lower portion of the seed layer 200 may be greater than the width 210LW at the lower portion of the first pinned layer 210.

A width BE_UW at an upper portion of the bottom electrode BE may be less than a width BE_LW at a lower portion of the bottom electrode BE. The bottom electrode BE may have a width that progressively decreases as approaching the upper portion from the lower portion thereof. Therefore, the bottom electrode BE may have a positive profile at its lateral surface inclined at an acute angle with respect to a bottom surface of the bottom electrode BE. According to some example embodiments, an angle between the lateral and bottom surfaces of the bottom electrode BE may be greater (e.g., more perpendicular) than an angle between the lateral and bottom surfaces of the seed layer 200. The width BE_UW at the upper portion of the bottom electrode BE may be greater than the width 200UW at the upper portion of the seed layer 200 and substantially the same as the width 200LW at the lower portion of the seed layer 200. The width BE_LW at the lower portion of the bottom electrode BE may be greater than the width 200LW at the lower portion of the seed layer 200.

The bottom electrode BE, the top electrode TE, and each of the layers 200, 210, 220, TBR, 230, 240, and 250 that constitute the magnetic tunnel junction pattern MTJ may have a thickness in a direction (e.g., the first direction D1) perpendicular to the interface between the tunnel barrier pattern TBR and the free layer 230. For example, the first direction D1 may be perpendicular to the top surface 100U of the substrate 100.

The free layer 230 may have a thickness 230T greater than a thickness TBR T of the tunnel barrier pattern TBR and a thickness 240T of the non-magnetic layer 240. The thickness TBR T of the tunnel barrier pattern TBR may be substantially the same as the thickness 240T of the non-magnetic layer 240. The capping layer 250 may have a thickness 250T greater than the thickness 230T of the free layer 230, and the top electrode TE may have a thickness TE_T greater than the thickness 250T of the capping layer 250.

The second pinned layer 220 may have a thickness 220T greater than the thickness 230T of the free layer 230 and the thickness 250T of the capping layer 250. The thickness 220T of the second pinned layer 220 may be less than the thickness TE_T of the top electrode TE. The first pinned layer 210 may have a thickness 210T less than the thickness 220T of the second pinned layer 220 and greater than the thickness 230T of the free layer 230. The thickness 210T of the first pinned layer 210 may be less than the thickness 250T of the capping layer 250.

The seed layer 200 may have a thickness 200T greater than the thickness 210T of the first pinned layer 210 and less than the thickness 220T of the second pinned layer 220. The thickness 200T of the seed layer 200 may be less than the thickness 250T of the capping layer 250.

The bottom electrode BE may have a thickness BE_T greater than that of each of the seed layer 200, the first pinned layer 210, the second pinned layer 220, the tunnel barrier pattern TBR, the free layer 230, the non-magnetic layer 240, and the capping layer 250. The thickness BE_T of the bottom electrode BE may be less than the thickness TE_T of the top electrode TE.

According to some example embodiments, the data storage structure DS of FIG. 3 may have a profile that is defined by the described widths and thicknesses of the bottom electrode BE, the top electrode TE, and each of the layers 200, 210, 220, TBR, 230, 240, and 250 that constitute the magnetic tunnel junction pattern MTJ, and accordingly the magnetic tunnel junction pattern MTJ in the data storage structure DS may be prevented from degradation of characteristics thereof.

Figure 6:
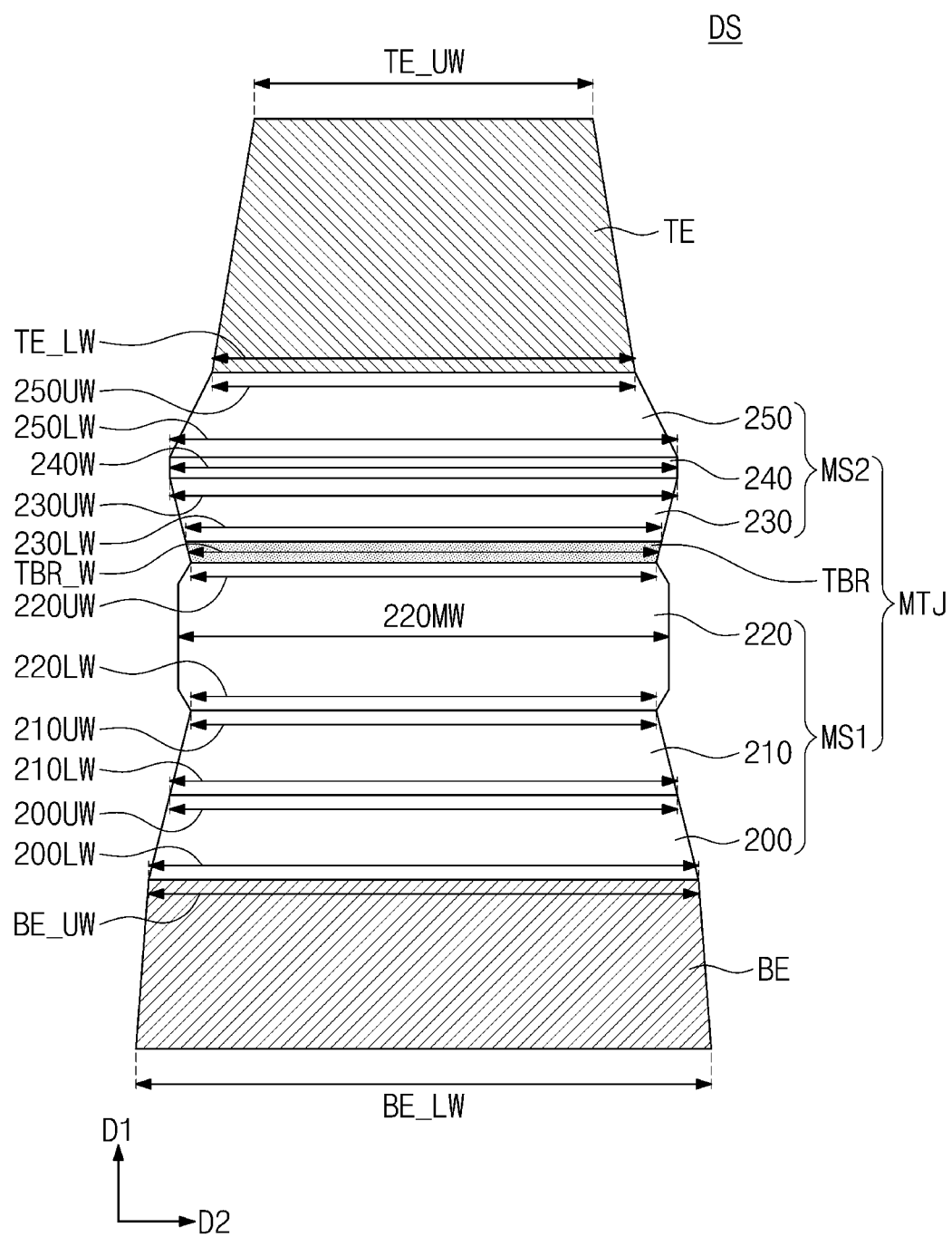
FIG. 6 illustrates a cross-sectional view showing a data storage structure of a magnetic memory device according to some example embodiments of the present inventive concepts.

FIG. 6 illustrates a cross-sectional view showing a data storage structure of a magnetic memory device according to some example embodiments of the present inventive concepts.

Referring to FIG. 6, according to some example embodiments, the width TE_UW at the upper portion of the top electrode TE may be less than the width TE_LW at the lower portion of the top electrode TE. The top electrode TE may have a width that progressively decreases as approaching the upper portion from the lower portion thereof. Therefore, the top electrode TE may have a positive profile at its lateral surface inclined at an acute angle with respect to the bottom surface of the top electrode TE. The width TE_UW at the upper portion of the top electrode TE may be less than the width 250UW at the upper portion of the capping layer 250, and the width TE_LW at the lower portion of the top electrode TE may be substantially the same as the width 250UW at the upper portion of the capping layer 250. The data storage structure DS according to the present embodiment may be substantially the same as the data storage structure DS discussed with reference to FIGS. 5A and 5B, except the differences described above.

FIGS. 7 to 12 illustrate cross-sectional views taken along lines I-I' and II-II' of FIG. 2, showing a method of fabricating a magnetic memory device according to some example embodiments of the present inventive concepts. The same or similar technical features as those of the magnetic memory device discussed with reference to FIGS. 1 to 6 will be omitted for brevity of description.

Figure 7:
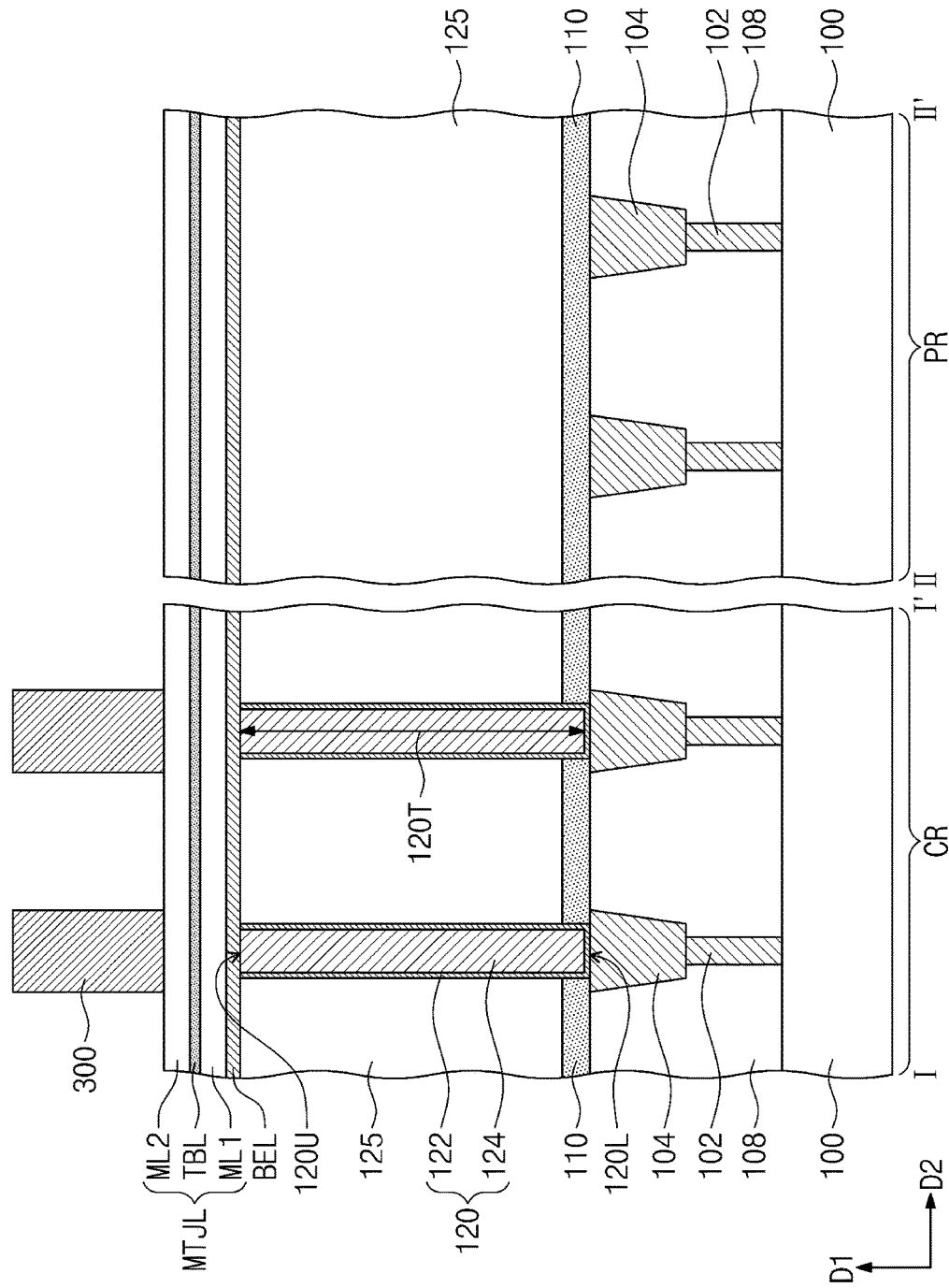
FIGS. 7, 8, 9, 10, 11, and 12 illustrate cross-sectional views taken along lines I-I' and II-II' of FIG. 2, showing a method of fabricating a magnetic memory device according to some example embodiments of the present inventive concepts.

Referring to FIG. 7, a substrate 100 may be provided which includes a cell region CR and a peripheral circuit region PR. Select elements may be formed in the substrate 100, and lower lines 104 and lower contacts 102 may be formed on the substrate 100. Each of the lower lines 104 may be electrically connected through a corresponding one of the lower contacts 102 to one terminal of a corresponding one of the select elements. A first lower interlayer dielectric layer 108 may be formed on the substrate 100 to cover the cell region CR and the peripheral circuit region PR and also to cover the lower lines 104 and the lower contacts 102. The lower lines 104 may have their top surfaces substantially coplanar with that of the first lower interlayer dielectric layer 108.

A lower dielectric layer 110 and a second lower interlayer dielectric layer 125 may be sequentially formed on the first lower interlayer dielectric layer 108. The lower dielectric layer 110 and the second lower interlayer dielectric layer 125 may cover the cell region CR and the peripheral circuit region PR. A lower contact plug 120 may be formed on the cell region CR of the substrate 100. The lower contact plug 120 may penetrate the second lower interlayer dielectric layer 125 and the lower dielectric layer 110, and may have a connection with a corresponding one of the lower lines 104. The formation of the lower contact plug 120 may include, for example, forming a lower contact hole that penetrates the lower dielectric layer 110 and the second lower interlayer dielectric layer 125, sequentially forming a lower barrier layer and a lower contact layer on the second lower interlayer dielectric layer 125 to fill the lower contact hole, and performing a planarization process to planarize the lower barrier layer and the lower contact layer until a top surface of the second lower interlayer dielectric layer 125 is exposed. The planarization process may allow the lower contact plug 120 to include a lower contact pattern 124 and a lower barrier pattern 122 that are locally formed in the lower contact hole. The second lower interlayer dielectric layer 125 may not cover but may expose a top surface 120U of the lower contact plug 120. The lower contact plug 120 may be formed to have a first thickness 120T, and the first thickness 120T may be a vertical length measured along a first direction D1 from a bottom surface 120L of the lower contact plug 120 to the top surface 120U of the lower contact plug 120.

A bottom electrode layer BEL and a magnetic tunnel junction layer MTJL may be sequentially formed on the second lower interlayer dielectric layer 125. The bottom electrode layer BEL may be formed to cover the exposed top surface 120U of the lower contact plug 120 and the exposed top surface of the second lower interlayer dielectric layer 125. Each of the bottom electrode layer BEL and the magnetic tunnel junction layer MTJL may cover the cell region CR and the peripheral circuit region PR of the substrate 100. The magnetic tunnel junction layer MTJL may include a first magnetic layer ML1, a tunnel barrier layer TBL, and a second magnetic layer ML2 that are sequentially stacked on the bottom electrode layer BEL. Each of the first and second magnetic layers ML1 and ML2 may include at least one magnetic layer. For example, the first magnetic layer ML1 may include the seed layer 200, the first pinned layer 210, and the second pinned layer 220 that are discussed above with reference to FIGS. 5A and 5B, and the second magnetic layer ML2 may include the free layer 230, the non-magnetic layer 240, and the capping layer 250 that are discussed above with reference to FIGS. 5A and 5B. The first magnetic layer ML1, the tunnel barrier layer TBL, and the second magnetic layer ML2 may be formed by sputtering, chemical vapor deposition, or atomic layer deposition.

A conductive mask pattern 300 may be formed on the magnetic tunnel junction layer MTJL on the cell region CR. The conductive mask pattern 300 may define a region at which a magnetic tunnel junction pattern is formed, as discussed below. The conductive mask pattern 300 may include metal (e.g., Ta, W, Ru, or Ir) and/or conductive metal nitride (e.g., TiN).

Figure 8:
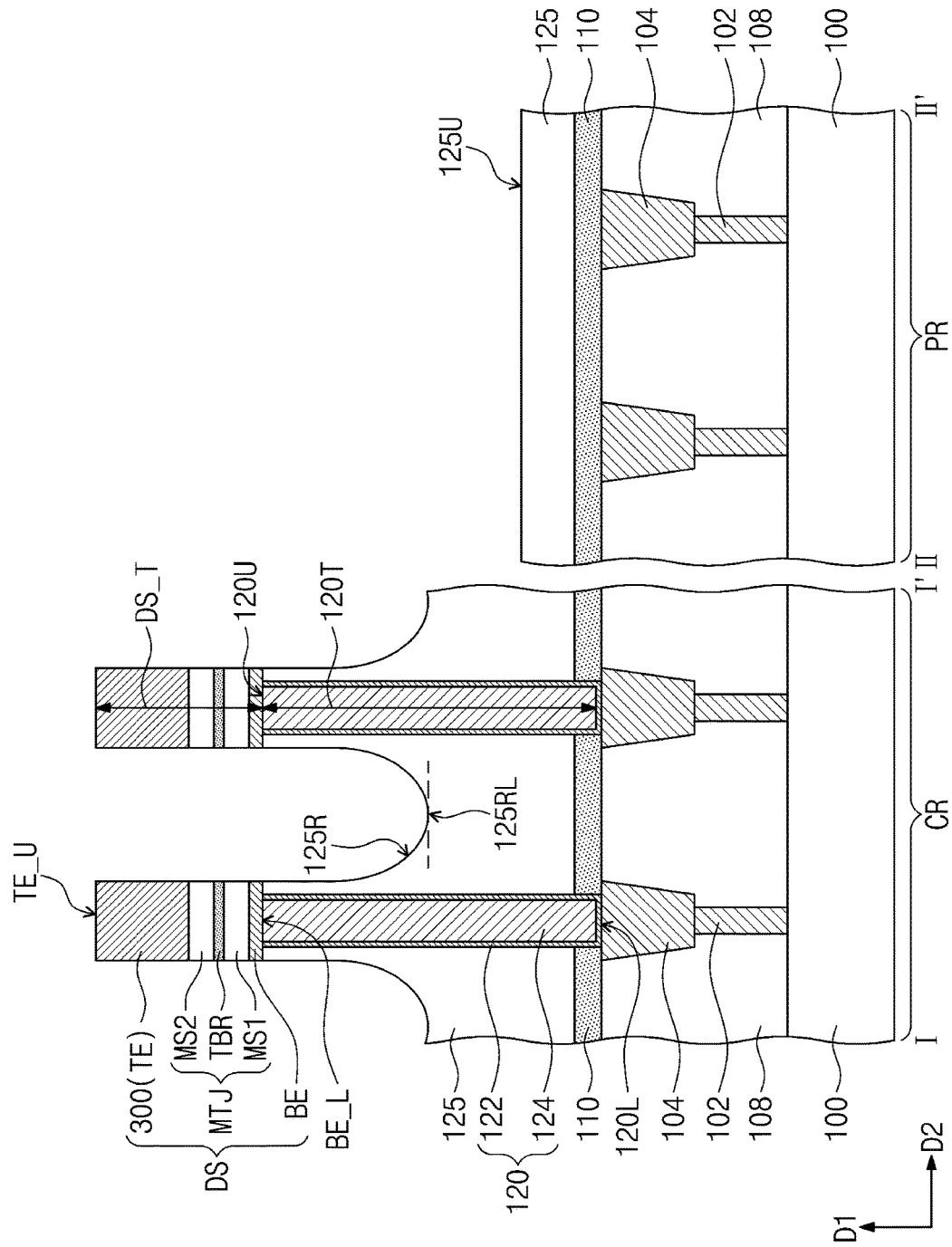

Referring to FIG. 8, an etching process may be performed in which the conductive mask pattern 300 may be used as an etching mask to sequentially etch the magnetic tunnel junction layer MTJL and the bottom electrode layer BEL. Therefore, a magnetic tunnel junction pattern MTJ and a bottom electrode BE may be formed on the second lower interlayer dielectric layer 125 on the cell region CR. The bottom electrode BE may be connected to the lower contact plug 120, and the magnetic tunnel junction pattern MTJ may be formed on the bottom electrode BE. The magnetic tunnel junction pattern MTJ may include a first magnetic structure MS1, a tunnel barrier pattern TBR, and a second magnetic structure MS2 that are sequentially stacked on the bottom electrode BE. The first magnetic structure MS1 and the second magnetic structure MS2 may be spaced apart from each other across the tunnel barrier pattern TBR. The etching of the magnetic tunnel junction layer MTJL may include using the conductive mask pattern 300 as an etching mask to sequentially etch the second magnetic layer ML2, the tunnel barrier layer TBL, and the first magnetic layer ML1. The second magnetic layer ML2, the tunnel barrier layer TBL, and the first magnetic layer ML1 may be etched to form the second magnetic structure MS2, the tunnel barrier pattern TBR, and the first magnetic structure MS1, respectively. For example, the first magnetic structure MS1 may include the seed layer 200, the first pinned layer 210, and the second pinned layer 220 that are discussed above with reference to FIGS. 5A and 5B, and the second magnetic structure MS2 may include the free layer 230, the non-magnetic layer 240, and the capping layer 250 that are discussed above with reference to FIGS. 5A and 5B.

For example, an ion beam etching process using an ion beam may be employed as the etching process that etches the magnetic tunnel junction layer MTJL and the bottom electrode layer BEL. The ion beam may include inert ions. The etching process may recess an upper portion of the second lower interlayer dielectric layer 125 on opposite sides of the magnetic tunnel junction pattern MTJ. Thus, the second lower interlayer dielectric layer 125 on the cell region CR may have a recess 125R extending toward the substrate 100 on opposite sides of the magnetic tunnel junction pattern MTJ. The recess 125R may have a lowermost surface 125RL located at a height lower than that of the top surface 120U of the lower contact plug 120. In addition, the etching process may etch an upper portion of the second lower interlayer dielectric layer 125 on the peripheral circuit region PR. The second lower interlayer dielectric layer 125 on the peripheral circuit region PR may have a top surface 125U located at a height lower than that of the lowermost surface 125RL of the recess 125R of the second lower interlayer dielectric layer 125 on the cell region CR.

After the etching process, a residue of the conductive mask pattern 300 may remain on the magnetic tunnel junction pattern MTJ. The residue of the conductive mask pattern 300 may serve as a top electrode TE. Hereinafter, the residue of the conductive mask pattern 300 may be called the top electrode TE. The top electrode TE, the magnetic tunnel junction pattern MTJ, and the bottom electrode BE may constitute a data storage structure DS.

The etching process may be performed such that the data storage structure DS is formed to have a second thickness DS_T. The second thickness DS_T may be a vertical length measured along the first direction D1 from a bottom surface BE_L of the bottom electrode BE to a top surface TE_U of the top surface TE. The first thickness 120T of the lower contact plug 120 may be about 2.0 to 3.6 times the second thickness DS_T of the data storage structure DS. Moreover, deposition processes that deposit layers constituting the data storage structure DS and the etching process that etches the deposited layers may be performed such that the data storage structure DS may be formed to have the profile discussed above with reference to FIG. 5A, 5B, or 6.

Figure 9:
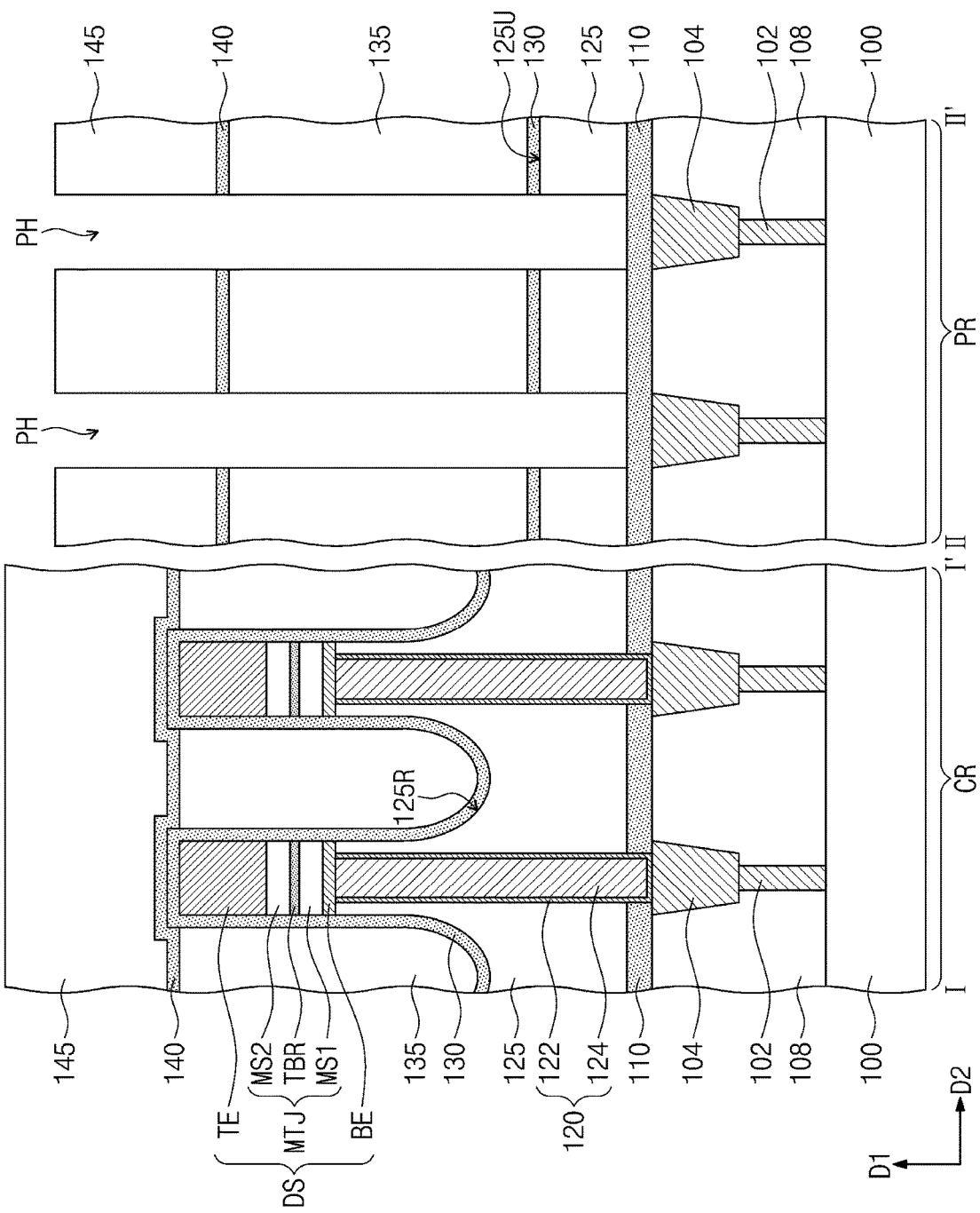

Referring to FIG. 9, a protective dielectric layer 130 may be formed on the second lower interlayer dielectric layer 125 to cover the data storage structure DS. The protective dielectric layer 130 may be formed to conformally cover top and lateral surfaces of the data storage structure DS and to extend along an inner surface of the recess 125R of the second lower interlayer dielectric layer 125. The protective dielectric layer 130 may extend along the top surface 125U of the second lower interlayer dielectric layer 125 on the peripheral circuit region PR.

A first upper interlayer dielectric layer 135 may be formed on the protective dielectric layer 130 to cover the data storage structure DS. The first upper interlayer dielectric layer 135 may cover the protective dielectric layer 130 on the peripheral circuit region PR. An upper dielectric layer 140 and a second upper interlayer dielectric layer 145 may be sequentially formed on the first upper interlayer dielectric layer 135. The upper dielectric layer 140 may be interposed between the first upper interlayer dielectric layer 135 and the second upper interlayer dielectric layer 145. Each of the upper dielectric layer 140 and the second upper interlayer dielectric layer 145 may cover the cell region CR and the peripheral circuit region PR of the substrate 100. The first and second lower interlayer dielectric layers 108 and 125, the first and second upper interlayer dielectric layers 135 and 145, the lower dielectric layer 110, the protective dielectric layer 130, and the upper dielectric layer 140 may each be formed by performing a chemical vapor deposition process, a physical vapor deposition process, or an atomic layer deposition process.

Preliminary holes PH may be formed on the peripheral circuit region PR of the substrate 100. Each of the preliminary holes PH may penetrate the second upper interlayer dielectric layer 145, the upper dielectric layer 140, the first upper interlayer dielectric layer 135, the protective dielectric layer 130, and the second lower interlayer dielectric layer 125, and may expose a top surface of the lower dielectric layer 110. The formation of the preliminary holes PH may include forming on the second upper interlayer dielectric layer 145 a first mask pattern having openings that define regions where the preliminary holes PH will be formed, and then using the first mask pattern as an etching mask to sequentially etch the second upper interlayer dielectric layer 145, the upper dielectric layer 140, the first upper interlayer dielectric layer 135, the protective dielectric layer 130, and the second lower interlayer dielectric layer 125. Afterwards, the first mask pattern may be removed.

Figure 10:
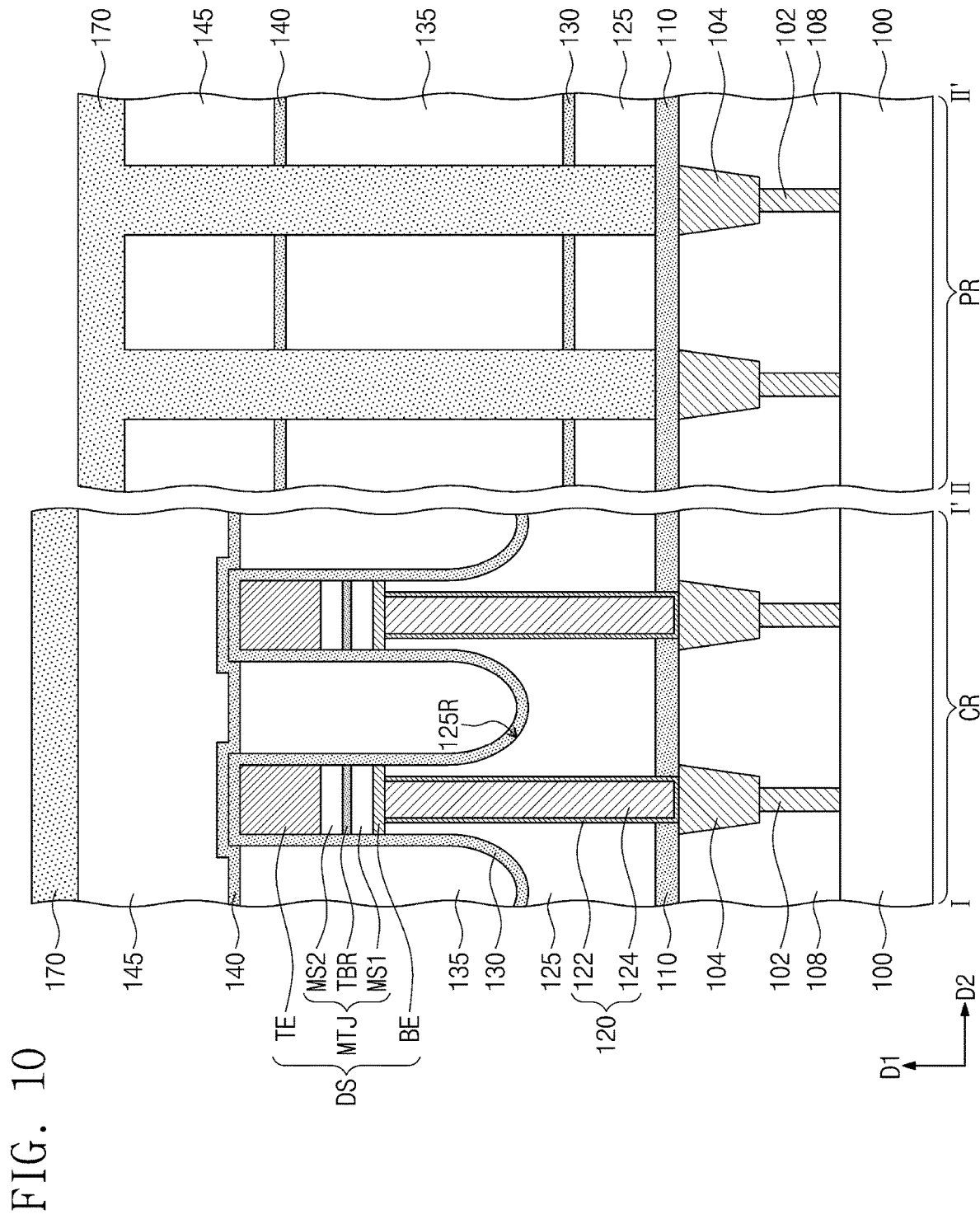

Referring to FIG. 10, a sacrificial layer 170 may be formed on the second upper interlayer dielectric layer 145 to fill the preliminary holes PH. The sacrificial layer 170 may cover the second upper interlayer dielectric layer 145 on the cell region CR and the peripheral circuit region PR. The sacrificial layer 170 may include, for example, a carbon-containing material.

Figure 11:
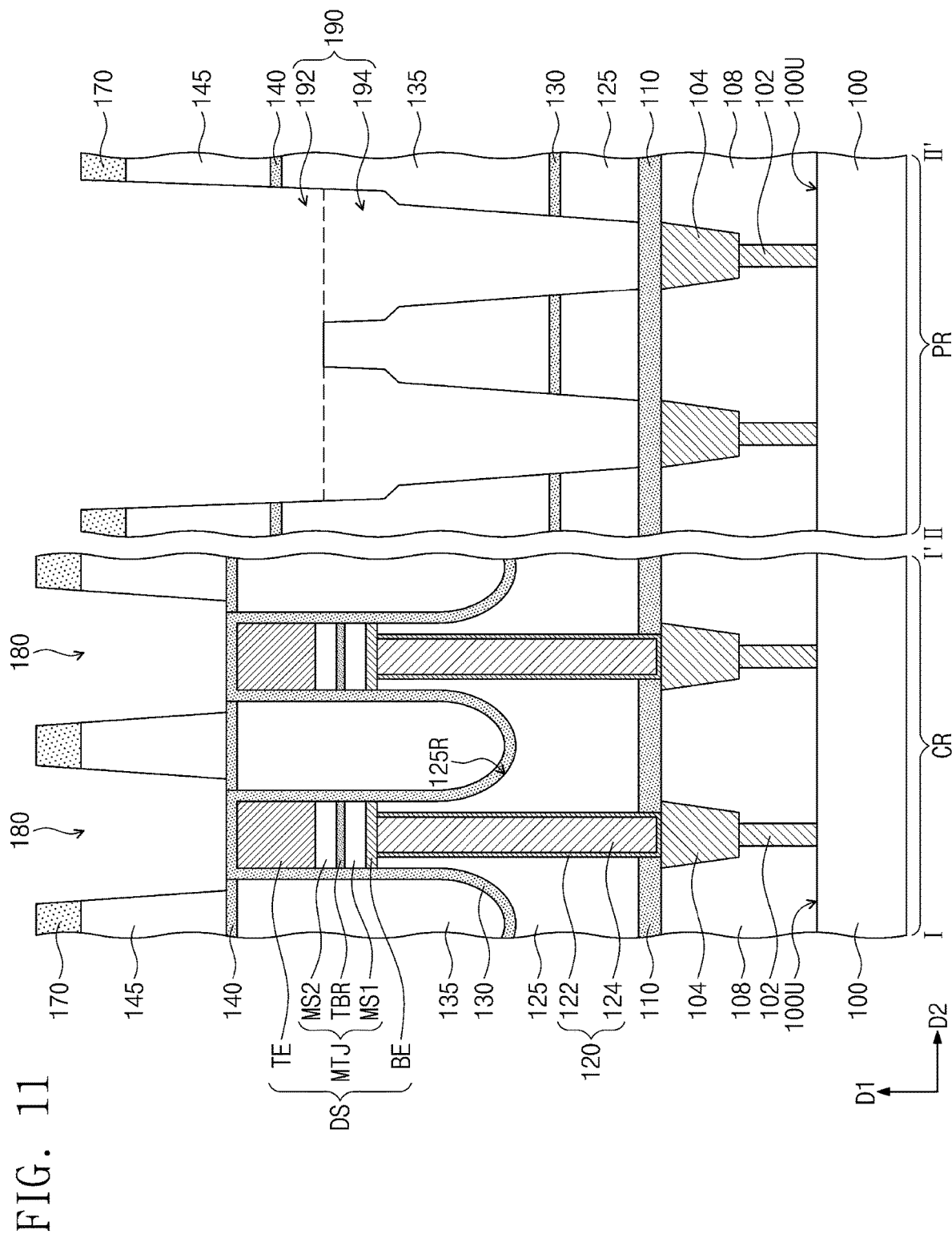

Referring to FIG. 11, on the cell region CR, a first etching process may be performed in which the sacrificial layer 170, the second upper interlayer dielectric layer 145, and the upper dielectric layer 140 may be patterned to form a cell trench 180 in the second upper interlayer dielectric layer 145. The first etching process may continue until the protective dielectric layer 130 on the cell region CR is exposed. The cell trench 180 may expose a top surface of the protective dielectric layer 130 on the cell region CR.

On the peripheral circuit region PR, the first etching process may pattern the sacrificial layer 170, the second upper interlayer dielectric layer 145, the upper dielectric layer 140, the first upper interlayer dielectric layer 135, the protective dielectric layer 130, and the second lower interlayer dielectric layer 125. Therefore, on the peripheral circuit region PR, a through hole 190 may be formed to penetrate the second upper interlayer dielectric layer 145, the upper dielectric layer 140, the first upper interlayer dielectric layer 135, the protective dielectric layer 130, and the second lower interlayer dielectric layer 125. The through hole 190 may include a peripheral trench 192 that extends in a direction (e.g., a second direction D2) parallel to the top surface 100U of the substrate 100, and may also include contact holes 194 that extend from the peripheral trench 192 toward the substrate 100. The contact holes 194 may be spaced apart from each other in a horizontal direction (e.g., the second direction D2), and the peripheral trench 192 may be spatially connected in common to (e.g., to multiple of) the contact holes 194. The peripheral trench 192 may penetrate the second upper interlayer dielectric layer 145 and the upper dielectric layer 140, and may further penetrate an upper portion of the first upper interlayer dielectric layer 135. Each of the contact holes 194 may penetrate the first upper interlayer dielectric layer 135, the protective dielectric layer 130, and the second lower interlayer dielectric layer 125. The first etching process may continue until the lower dielectric layer 110 on the peripheral circuit region PR is exposed. Each of the contact holes 194 may expose a top surface of the lower dielectric layer 110.

Referring to FIGS. 10 and 11, during the first etching process, the sacrificial layer 170 may be etched at an etch rate greater than that of each of the second upper interlayer dielectric layer 145, the upper dielectric layer 140, the first upper interlayer dielectric layer 135, the protective dielectric layer 130, and the second lower interlayer dielectric layer 125. As the first etching process etches the sacrificial layer 170, a top surface of the second upper interlayer dielectric layer 145 on the cell region CR and the peripheral circuit region PR may be exposed during the first etching process. In addition, on the peripheral circuit region PR, as the first etching process etches the sacrificial layer 170 that fills the preliminary holes PH, a lateral surface of each of the second upper interlayer dielectric layer 145, the upper dielectric layer 140, the first upper interlayer dielectric layer 135, the protective dielectric layer 130, and the second lower interlayer dielectric layer 125 may be exposed during the first etching process. In this case, while the second upper interlayer dielectric layer 145 and the upper dielectric layer 140 are etched during the first etching process on the cell region CR, the first etching process may etch the second upper interlayer dielectric layer 145, the upper dielectric layer 140, the first upper interlayer dielectric layer 135, the protective dielectric layer 130, and the second lower interlayer dielectric layer 125 on the peripheral circuit region PR. Accordingly, the first etching process may form the cell trench 180 on the cell region CR simultaneously with the through hole 190 on the peripheral circuit region PR.

During the first etching process, the upper dielectric layer 140 may be etched at an etch rate less than that of the first upper interlayer dielectric layer 135. In this case, during the first etching process, at least a portion of the first upper interlayer dielectric layer 135 on the peripheral circuit region PR may be etched faster at its upper portion than at its lateral surface. For this reason, the first upper interlayer dielectric layer 135 may have a stepwise profile at a lateral surface of a portion thereof.

Figure 12:
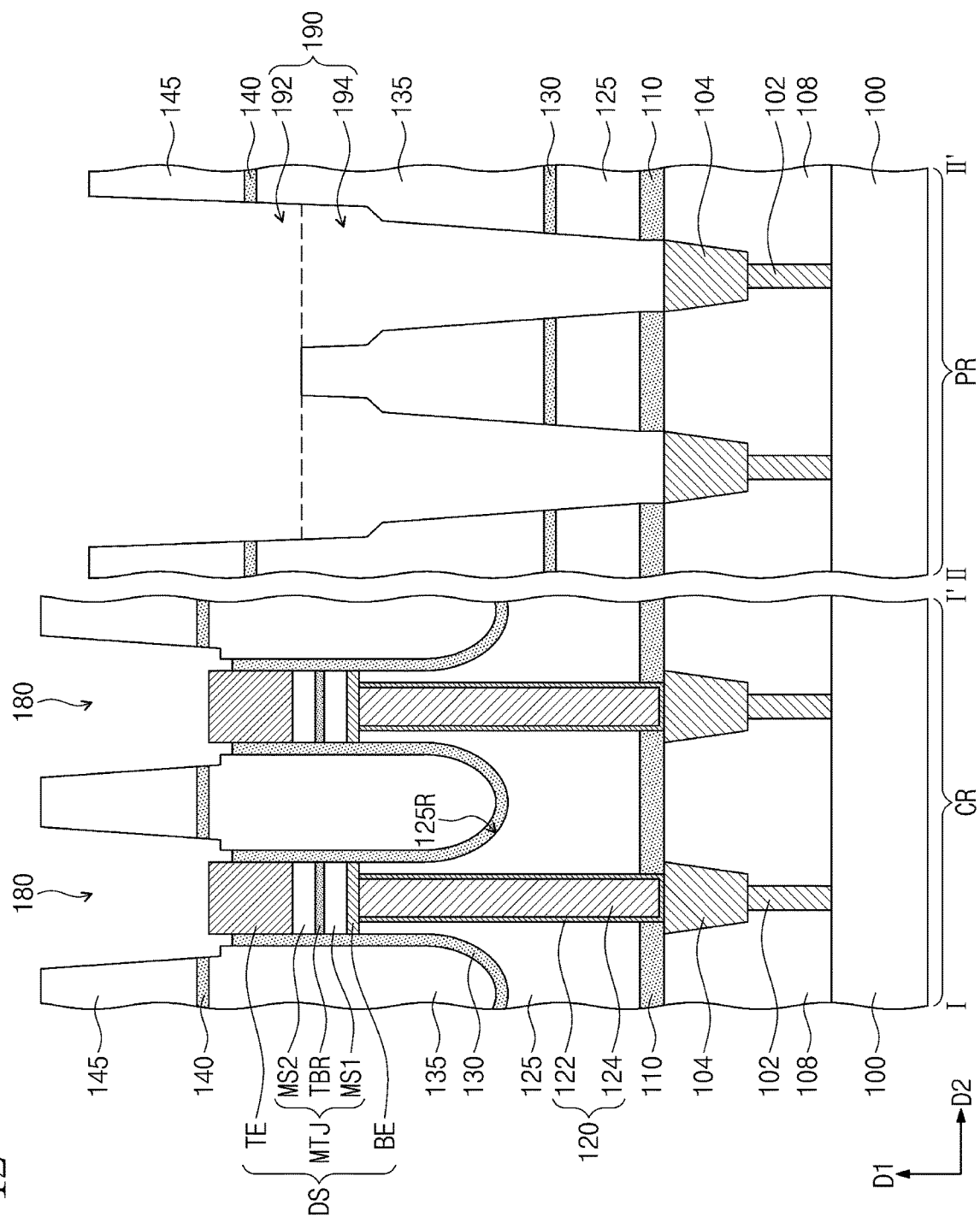

Referring to FIG. 12, a second etching process may be performed to partially etch the protective dielectric layer 130 exposed to the cell trench 180 and the lower dielectric layer 110 exposed to the contact holes 194. Therefore, the cell trench 180 may expose a top surface of the top electrode TE, and the contact holes 194 may expose corresponding lower lines 104 on the peripheral circuit region PR. According to some example embodiments, the second etching process may cause the cell trench 180 to extend onto a lateral surface of the top electrode TE and to expose a portion of the lateral surface of the top electrode TE.

Referring back to FIGS. 2 and 3, an upper line 150 and a peripheral line structure 160 may be formed in the cell trench 180 and the through hole 190, respectively. The upper line 150 may include an upper line pattern 154 and an upper barrier pattern 152 that extends along lateral and bottom surfaces of the upper line pattern 154. The peripheral line structure 160 may include a peripheral conductive pattern 164 and a peripheral barrier pattern 162 that extends along lateral and bottom surfaces of the peripheral conductive pattern 164. The peripheral conductive pattern 164 may include a line pattern LP in the peripheral trench 192 and contact patterns CP in the contact holes 194.

The upper line 150 may be formed to have a third thickness 150T, and the third thickness 150T may be a vertical length measured along the first direction D1 from a bottom surface 150L of the upper line 150 to a top surface 150U of the upper line 150. The third thickness 150T of the upper line 150 may be about 1.0 to 2.2 times the second thickness DS_T of the data storage structure DS.

The formation of the upper line 150 and the peripheral line structure 160 may include forming on the second upper interlayer dielectric layer 145 a barrier layer that partially fills the cell trench 180 and the through hole 190, forming on the barrier layer a conductive layer that fills a remaining portion of each of the cell trench 180 and the through hole 190, and performing a planarization process to planarize the conductive layer and the barrier layer until a top surface of the second upper interlayer dielectric layer 145 is exposed. The barrier layer may be formed to conformally cover an inner surface of each of the cell trench 180 and the through hole 190. The barrier layer may include conductive metal nitride, and the conductive layer may include metal (e.g., copper). The planarization process may be performed such that a top surface of the upper line pattern 154 and an uppermost surface of the upper barrier pattern 152 may be substantially coplanar with the top surface of the second upper interlayer dielectric layer 145 on the cell region CR. In addition, the planarization process may be performed such that a top surface of the peripheral conductive pattern 164 and an uppermost surface of the peripheral barrier pattern 162 may be substantially coplanar with the top surface of the second upper interlayer dielectric layer 145 on the peripheral circuit region PR.

According to the present inventive concepts, the first thickness 120T of the lower contact plug 120 may be about 2.0 to 3.6 times the second thickness DS_T of the data storage structure DS, and the third thickness 150T of the upper line 150 may be about 1.0 to 2.2 times the second thickness DS_T of the data storage structure DS. In this case, it may be possible to reduce or minimize process defects caused by an increase in aspect ratio of the lower contact plug 120 and also to reduce or prevent degradation of characteristics of the magnetic tunnel junction pattern MTJ in the data storage structure DS. Furthermore, the data storage structure DS may be formed to have the profile discussed above with reference to FIG. 5A, 5B, or 6, and therefore degradation of characteristics of the magnetic tunnel junction pattern MTJ in the data storage structure DS may be reduced or prevented. As a result, a magnetic memory device having a structure capable of reducing or minimizing process defects with excellent characteristics and a method of fabricating the same may be provided.

According to the present inventive concepts, it may be possible to reduce or minimize process defects caused by an increase in aspect ratio of a lower contact plug and also to reduce or prevent degradation of characteristics of a data storage structure in a magnetic tunnel junction pattern. In conclusion, the present inventive concepts may provide a magnetic memory device having a structure capable of reducing or minimizing process defects with excellent characteristics and a method of fabricating the same.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A magnetic memory device, comprising:
   a lower contact plug on a substrate; and
   a data storage structure on the lower contact plug,
   wherein the data storage structure comprises a bottom electrode, a magnetic tunnel junction pattern, and a top electrode that are sequentially stacked on the lower contact plug, and
   wherein the lower contact plug and the data storage structure have a first thickness and a second thickness, respectively, in a first direction perpendicular to a top surface of the substrate,
   wherein the first thickness of the lower contact plug is about 2.0 to 3.6 times the second thickness of the data storage structure.

2. The magnetic memory device of claim 1, further comprising:
   a lower line between the substrate and the lower contact plug, wherein the lower line connects the lower contact plug to a select element; and
   an upper line on the data storage structure, wherein the upper line connects the data storage structure to a bit line.

3. The magnetic memory device of claim 2, wherein:
   a bottom surface of the lower contact plug is in contact with the lower line;
   a top surface of the lower contact plug is in contact with the bottom electrode of the data storage structure; and
   the first thickness is defined between the bottom surface of the lower contact plug and the top surface of the lower contact plug.

4. The magnetic memory device of claim 2, wherein:
   a bottom surface of the bottom electrode is in contact with the lower contact plug;
   a top surface of the top electrode is in contact with the upper line;
   the magnetic tunnel junction pattern is between the bottom electrode and the top electrode; and
   the second thickness is defined between the bottom surface of the bottom electrode and the top surface of the top electrode.

5. The magnetic memory device of claim 2, wherein the upper line extends onto a top surface of the top electrode, and onto a portion of a lateral surface of the top electrode.

6. The magnetic memory device of claim 2, wherein the upper line has a third thickness in the first direction, and wherein the third thickness of the upper line is about 1.0 to 2.2 times the second thickness of the data storage structure.

7. The magnetic memory device of claim 6, wherein:
   a bottom surface of the upper line is in contact with the top electrode of the data storage structure; and
   the third thickness is defined between the bottom surface of the upper line and a top surface of the upper line.

8. The magnetic memory device of claim 2, further comprising:
   a first lower interlayer dielectric layer on the substrate and covering the lower line;
   a second lower interlayer dielectric layer on the first lower interlayer dielectric layer and covering the lower contact plug; and
   a lower dielectric layer between the first and second lower interlayer dielectric layers,
   wherein the data storage structure is on the second lower interlayer dielectric layer,
   wherein the lower contact plug penetrates the second lower interlayer dielectric layer and the lower dielectric layer and contacts the lower line, and
   wherein the second lower interlayer dielectric layer comprises a recess therein at a side of the data storage structure,
   wherein a lowermost surface of the recess of the second lower interlayer dielectric layer is closer to the substrate than a top surface of the lower contact plug.

9. The magnetic memory device of claim 8, wherein:
   the substrate comprises a cell region and a peripheral circuit region;
   the lower line, the lower contact plug, the data storage structure, and the upper line are on the cell region;
   the first and second lower interlayer dielectric layers and the lower dielectric layer cover the cell region and the peripheral circuit region; and
   a top surface of the second lower interlayer dielectric layer on the peripheral circuit region is closer to the substrate than the lowermost surface of the recess of the second lower interlayer dielectric layer on the cell region.

10. The magnetic memory device of claim 9, further comprising:
    a first upper interlayer dielectric layer on the second lower interlayer dielectric layer and covering the data storage structure;
    a second upper interlayer dielectric layer on the first upper interlayer dielectric layer and covering the upper line; and
    an upper dielectric layer between the first and second upper interlayer dielectric layers,
    wherein the upper line penetrates the second upper interlayer dielectric layer and the upper dielectric layer and contacts the data storage structure,
    wherein the first and second upper interlayer dielectric layers and the upper dielectric layer cover the cell region and the peripheral circuit region, and
    wherein a first top surface of the upper dielectric layer on the peripheral circuit region is closer to the substrate than a second top surface of the upper dielectric layer on the cell region.

11. The magnetic memory device of claim 10, further comprising:
    a protective dielectric layer that is between the first upper interlayer dielectric layer and a lateral surface of the data storage structure, and is between the first upper interlayer dielectric layer and the recess of the second lower interlayer dielectric layer on the cell region,
    wherein the protective dielectric layer further extends between the second lower interlayer dielectric layer and the first upper interlayer dielectric layer on the peripheral circuit region.

12. A magnetic memory device, comprising:
a lower contact plug connected to a select element on a substrate; and
a data storage structure comprising a magnetic tunnel junction pattern on the lower contact plug,
wherein a first thickness of the lower contact plug is about 2.0 to 3.6 times a second thickness of the data storage structure in a first direction perpendicular to a top surface of the substrate, and
wherein, a middle portion of the magnetic tunnel junction pattern is wider than an upper portion and a lower portion of the magnetic tunnel junction pattern in a second direction parallel to the top surface of the substrate.

* * * * *